(12) United States Patent
Walke et al.

(10) Patent No.: US 10,727,869 B1
(45) Date of Patent: Jul. 28, 2020

(54) EFFICIENT METHOD FOR PACKING LOW-DENSITY PARITY-CHECK (LDPC) DECODE OPERATIONS

(71) Applicant: Xilinx, Inc., San Jose, CA (US)

(72) Inventors: Richard L. Walke, Edinburgh (GB); Andrew Dow, Edinburgh (GB)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 15/938,760

(22) Filed: Mar. 28, 2018

(51) Int. Cl.
*H03M 13/00* (2006.01)
*H03M 13/11* (2006.01)

(52) U.S. Cl.
CPC ...... *H03M 13/116* (2013.01); *H03M 13/1105* (2013.01); *H03M 13/1182* (2013.01); *H03M 13/616* (2013.01)

(58) Field of Classification Search
None
See application file for complete search history.

(56) References Cited

U.S. PATENT DOCUMENTS

| | | | |
|---|---|---|---|
| 7,539,926 | B1 | 5/2009 | Lesea |
| 7,730,377 | B2 * | 6/2010 | Hocevar ............ H03M 13/1117 714/6.24 |
| 8,065,598 | B1 | 11/2011 | Gunnam et al. |
| 8,140,932 | B2 * | 3/2012 | Blankenship ..... H03M 13/2739 714/702 |
| 8,291,283 | B1 | 10/2012 | Rad et al. |
| 8,429,483 | B1 | 4/2013 | Varnica et al. |
| 8,438,459 | B2 | 5/2013 | Cho et al. |
| 8,489,957 | B2 | 7/2013 | Wesel et al. |
| 8,612,835 | B2 | 12/2013 | Yokokawa |
| 8,713,397 | B2 | 4/2014 | Yang et al. |
| 8,751,902 | B2 * | 6/2014 | Jin ..................... H03M 13/1102 714/752 |
| 8,984,376 | B1 | 3/2015 | Norrie |
| 9,083,383 | B1 | 7/2015 | Tunali et al. |
| 9,203,440 | B1 | 12/2015 | Tunali et al. |
| 9,413,390 | B1 | 8/2016 | Yin et al. |
| 9,548,759 | B1 | 1/2017 | Rad |

(Continued)

OTHER PUBLICATIONS

I. Tsatsaragkos and V. Paliouras, "A flexible layered LDPC decoder," 2011 8th International Symposium on Wireless Communication Systems, Aachen, 2011, pp. 36-40. (Year: 2011).*

(Continued)

*Primary Examiner* — Daniel F. McMahon
(74) *Attorney, Agent, or Firm* — Paradice and Li LLP

(57) ABSTRACT

A decoder circuit includes an input to receive a first codeword encoded based on a quasi-cyclic low-density parity-check (QC LDPC) code and a plurality of memory banks to store the received codeword. Each column of the received codeword is assigned to one of the plurality of memory banks based at least in part on an order of the plurality of columns in the received codeword. A first reordering stage is to change the memory bank assignment for one or more of the plurality of columns by reordering the columns in the received codeword. An LDPC decoder is to decode the reordered codeword stored in the plurality of memory banks based at least in part on the QC LDPC code. A second reordering stage is to output the decoded codeword from the plurality of memory banks based at least in part on an order of the columns in the first codeword.

20 Claims, 18 Drawing Sheets

(56) References Cited

U.S. PATENT DOCUMENTS

| | | |
|---|---|---|
| 9,577,675 B1 | 2/2017 | Varnica et al. |
| 9,667,276 B1 | 5/2017 | Tunali et al. |
| 10,484,012 B1 | 11/2019 | Tunali et al. |
| 2007/0220395 A1* | 9/2007 | Nimbalker .......... H03M 13/033 714/758 |
| 2008/0077843 A1 | 3/2008 | Cho et al. |
| 2008/0263425 A1* | 10/2008 | Lakkis ............... H03M 13/1105 714/752 |
| 2013/0031438 A1* | 1/2013 | Hu ..................... G06F 11/1012 714/752 |
| 2013/0061112 A1 | 3/2013 | Chen et al. |
| 2013/0139023 A1 | 5/2013 | Han et al. |
| 2014/0101510 A1 | 4/2014 | Wang et al. |
| 2014/0181612 A1 | 6/2014 | Gunnam et al. |
| 2015/0058692 A1* | 2/2015 | Bennatan ........... H03M 13/1111 714/752 |
| 2015/0227419 A1 | 8/2015 | Sakaue et al. |
| 2016/0055057 A1 | 2/2016 | Shin et al. |
| 2018/0159555 A1* | 6/2018 | Ryabinin .......... H03M 13/1575 |

OTHER PUBLICATIONS

Emran et al., "Simplified Variable-Scaled Min Sum LDPC decoder for irregular LDPC Codes," Proc. of the 2014 IEEE 11th Consumer Communications and Networking Conference (CCNC), Jan. 10, 2014, pp. 518-523, IEEE, Piscataway, New Jersey. USA.

Specification and drawings for U.S. Appl. No. 15/705,033, filed Sep. 14, 2017, Fraser et al.

Mansour, A. Turbo-Decoding Message-Passing Algorithm for Sparse Parity-Check Matrix Codes, IEEE Transactions of Signal Processing, vol. 54, No. 11, pp. 4376-4392, Nov. 2006.

Walke, R. et al., "User-Programmable LDPC Decoder," U.S. Appl. No. 16/112,588, filed Aug. 24, 2018.

Xilinx, Inc., Soft-Decision FEC Integrated Block v1.1, LogiCORE IP Product Guide, PG256, pp. 1-134, San Jose, California, Apr. 4, 2018.

Xilinx, Inc., Zynq UltraScale+ RFSoc Data Sheet: Overview, Advance Product Specification, DS889 V1.5, pp. 1-33, San Jose, California USA Zynq RFSoC <https:/www.xilinx.com/products/silicon-devices/soc/rfsoc.html>, Jul. 23, 2018.

* cited by examiner

200B

P=10

| 0 | 1 | 0 | 0 | 0 | 0 | 0 | 0 | 0 | 0 | ← p=1 |
|---|---|---|---|---|---|---|---|---|---|---|
| 0 | 0 | 1 | 0 | 0 | 0 | 0 | 0 | 0 | 0 | ← p=2 |
| 0 | 0 | 0 | 1 | 0 | 0 | 0 | 0 | 0 | 0 | ← p=3 |
| 0 | 0 | 0 | 0 | 1 | 0 | 0 | 0 | 0 | 0 | ← p=4 |
| 0 | 0 | 0 | 0 | 0 | 1 | 0 | 0 | 0 | 0 | ← p=5 |
| 0 | 0 | 0 | 0 | 0 | 0 | 1 | 0 | 0 | 0 | ← p=6 |
| 0 | 0 | 0 | 0 | 0 | 0 | 0 | 1 | 0 | 0 | ← p=7 |
| 0 | 0 | 0 | 0 | 0 | 0 | 0 | 0 | 1 | 0 | ← p=8 |
| 0 | 0 | 0 | 0 | 0 | 0 | 0 | 0 | 0 | 1 | ← p=9 |
| 1 | 0 | 0 | 0 | 0 | 0 | 0 | 0 | 0 | 0 | ← p=10 |

```
1    for b = 1:B
2        for p = 1:P
3            for l = 1:L_b
4                v_{l,p}^b = v_{l,p}^b - upd\_vnode_{l,p}^b
5            end
6            for l = 1:L_b
7                upd\_vnode_{l,p}^b = \alpha \min(|V_{l,p}^b|) \prod sign(V_{l,p}^b)
8            end
9            for l = 1:L_b
10               v_{l,p}^b = v_{l,p}^b + upd\_vnode_{l,p}^b
11           end
12       end
13   end
```

FIG. 4A

| Col.\Lay. | 0 | 1 | 2 | 3 | 4 | 5 | 6 | 7 | 8 | 9 | 10 | 11 |
|---|---|---|---|---|---|---|---|---|---|---|---|---|
| 0  ← Bank A | 1 | 1 | 1 | 1 | 1 | 1 | 1 | 1 | 1 | 1 | 1 | 1 |
| 1  ← Bank B |   | 1 |   |   |   |   |   | 1 | 1 |   |   |   |
| 2  ← Bank C |   |   | 1 |   |   |   |   |   |   |   | 1 |   |
| 3  ← Bank D |   |   |   | 1 |   | 1 |   |   | 1 |   |   |   |
| 4  ← Bank A | 1 | 1 | 1 | 1 | 1 | 1 | 1 | 1 | 1 | 1 | 1 | 1 |
| 5  ← Bank B | 1 |   |   |   |   |   |   |   | 1 |   | 1 |   |
| 6  ← Bank C |   |   | 1 |   |   | 1 |   |   |   |   |   |   |
| 7  ← Bank D |   | 1 |   |   |   |   |   |   |   |   | 1 | 1 |
| 8  ← Bank A | 1 | 1 | 1 | 1 | 1 | 1 | 1 | 1 | 1 | 1 | 1 | 1 |
| 9  ← Bank B |   |   |   | 1 |   |   | 1 |   |   |   |   | 1 |
| 10 ← Bank C |   |   | 1 |   | 1 |   |   |   |   | 1 |   |   |
| 11 ← Bank D | 1 |   |   |   |   |   |   |   | 1 |   |   |   |
| 12 ← Bank A | 1 |   |   |   |   | 1 |   |   |   |   |   | 1 |
| 13 ← Bank B | 1 | 1 |   |   |   |   |   |   |   |   |   |   |
| 14 ← Bank C |   | 1 | 1 |   |   |   |   |   |   |   |   |   |
| 15 ← Bank D |   |   | 1 | 1 |   |   |   |   |   |   |   |   |
| 16 ← Bank A |   |   |   | 1 | 1 |   |   |   |   |   |   |   |
| 17 ← Bank B |   |   |   |   | 1 | 1 |   |   |   |   |   |   |
| 18 ← Bank C |   |   |   |   |   | 1 | 1 |   |   |   |   |   |
| 19 ← Bank D |   |   |   |   |   |   | 1 | 1 |   |   |   |   |
| 20 ← Bank A |   |   |   |   |   |   |   | 1 | 1 |   |   |   |
| 21 ← Bank B |   |   |   |   |   |   |   |   | 1 | 1 |   |   |
| 22 ← Bank C |   |   |   |   |   |   |   |   |   | 1 | 1 |   |
| 23 ← Bank D |   |   |   |   |   |   |   |   |   |   | 1 | 1 |

| Memory 1010 | | | |
|---|---|---|---|
| Bank A | Bank B | Bank C | Bank D |
| $D_0$ | $D_1$ | $D_2$ | $D_8$ |
| $D_4$ | $D_{19}$ | $D_6$ | $D_7$ |
| | $D_9$ | $D_5$ | $D_{11}$ |
| | $D_{13}$ | $D_{14}$ | $D_{15}$ |
| | $D_{17}$ | $D_{16}$ | $D_{21}$ |
| | $D_{23}$ | $D_{12}$ | $D_{18}$ |
| | $D_{10}$ | $D_{20}$ | |
| | $D_3$ | | |
| | $D_{22}$ | | |

# EFFICIENT METHOD FOR PACKING LOW-DENSITY PARITY-CHECK (LDPC) DECODE OPERATIONS

TECHNICAL FIELD

Aspects of the present disclosure generally relate to integrated circuits, and specifically to low-density parity-check (LDPC) codes.

BACKGROUND

Low-density parity-check (LDPC) codes are a class of error-correcting codes that may be efficiently encoded and decoded in hardware. LDPC codes are linear codes that have sparse parity-check matrices. The sparseness of the parity-check matrices allows for relatively fast decoding and computationally-inexpensive error correction. Many practical LDPC code designs use quasi-cyclic (QC) LDPC codes to yield more efficient hardware parallelization. Layered decoding is an efficient way of decoding LDPC codes and is commonly used in a wide range of applications. More specifically, layered decoding offers multiple opportunities for parallel implementation. For example, an LDPC decoder implementing layered decoding may be capable of processing multiple rows of a parity-check matrix in a single cycle. However, the number of cycles needed to process an entire layer of a base matrix associated with a QC LDPC code may depend on the hardware resources of the decoder. Accordingly, it may be desirable to optimize the number of parallel decoding operations that can be performed by an LDPC decoder, when decoding QC LDPC codes, based at least in part on the available resources of the decoder.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Aspects of the present disclosure are directed to low-density parity-check (LDPC) decoders and methods of their operation. An example decoder circuit may include a plurality of memory banks, a first reordering stage, an LDPC decoder, and a second reordering stage. An input to the decoder circuit may receive a first codeword encoded based on a quasi-cyclic (QC) LDPC code. For example, data in the first codeword may be arranged in a plurality of columns. The plurality of memory banks is configured to store the received codeword. More specifically, each column of the received codeword may be assigned to one of the plurality of memory banks based at least in part on an order of the plurality of columns in the received codeword. The first reordering stage is configured to change the memory bank assignment for one or more of the plurality of columns by reordering the columns in the received codeword. The LDPC decoder is configured to decode the reordered codeword stored in the plurality of memory banks based at least in part on the QC LDPC code. The second reordering stage is configured to output the decoded codeword from the plurality of memory banks based at least in part on an order of the columns in the first codeword.

In some embodiments, the first reordering stage may reorder the columns in the received codeword based at least in part on a number of memory banks in the plurality of memory banks. In some aspects, the reordering of the columns in the received codeword is to increase a number of columns decoded in parallel by the LDPC decoder. In some other embodiments, the first reordering stage may reorder the columns in the received codeword based at least in part on selected columns of the received codeword that participate in the decoding. For example, the first reordering stage may reorder the columns in the received codeword to equalize a distribution of the selected columns across the plurality of memory banks.

In some embodiments, the first codeword may be associated with a base matrix (H) and the first reordering stage may be configured to reorder the plurality of columns in the received codeword based at least in part on a modification to the base matrix H. For example, the modification to the base matrix H may result in an extended base matrix ($H_E$). Thus, the LDPC decoder may be configured to decode the reordered codeword based on the extended base matrix $H_E$. The base matrix $H_E$ may comprise a plurality of layers. In some aspects, the LDPC decoder may be configured to process each of the plurality of layers of the extended base matrix $H_E$ in succession.

In some embodiments, the decoder circuit may further comprise a first multiplexer and a second multiplexer. The first multiplexer may be configured to change an order of the columns in the reordered codeword, for each of the plurality of layers, when reading the reordered codeword from the plurality of memory banks to the LDPC decoder. Further, the second multiplexer may be configured to change an order of the columns in the decoded codeword, for each of the plurality of layers, when writing the decoded codeword from the LDPC decoder to the plurality of memory banks.

In some embodiments, when reordering the columns in the received codeword, the first reordering stage may be configured to add one or more additional columns to the received codeword to produce an extended codeword. In some aspects, the plurality of memory banks may be configured to store each columns of the extended codeword.

An example method disclosed herein may be used to operate a decoder circuit comprising a plurality of memory banks. The method may include receiving a first codeword encoded based on a QC LDPC code, wherein the first codeword includes data arranged in a plurality of columns; assigning each column of the received codeword to one of the plurality of memory banks based at least in part on an order of the plurality of columns in the received codeword; reordering the columns in the received codeword to change the memory bank assignment for one or more of the plurality of columns; decoding the reordered codeword stored in the plurality of memory banks based at least in part on the QC LDPC code; and outputting the decoded codeword from the plurality of memory banks based at least in part on an order of the columns in the first codeword.

In some embodiments, the reordering of the columns in the received codeword may be based at least in part on a number of memory banks in the plurality of memory banks. In some aspects, the reordering of the columns in the received codeword is to increase a number of columns decoded in parallel by the LDPC decoder. In some other embodiments, the reordering of the columns in the received codeword may be based at least in part on selected columns of the received codeword that participate in the decoding. For example, the reordering of the columns in the received codeword may be to equalize a distribution of the selected columns across the plurality of memory banks.

In some embodiments, the first codeword may be associated with a base matrix H and the reordering of the plurality of columns in the received codeword may be based at least in part on a modification to the base matrix H. For example, the modification to the base matrix H may result in an extended base matrix $H_E$. Thus, the decoding of the reordered codeword may be based on the extended base matrix $H_E$. The base matrix $H_E$ may comprise a plurality of layers. In some aspects, the decoding of the reordered codeword may include processing each of the plurality of layers of the extended base matrix $H_E$ in succession.

In some embodiments, the method may further include changing an order of the columns in the reordered codeword, for each of the plurality of layers, when reading the reordered codeword from the plurality of memory banks to the LDPC decoder; and changing an order of the columns in the decoded codeword, for each of the plurality of layers, when writing the decoded codeword from the LDPC decoder to the plurality of memory banks.

In some embodiments, the method may further include adding one or more additional columns to the received codeword to produce an extended codeword; and storing each column of the extended codeword in the plurality of memory banks.

BRIEF DESCRIPTION OF THE DRAWINGS

The example embodiments are illustrated by way of example and are not intended to be limited by the figures of the accompanying drawings. Like numbers reference like elements throughout the drawings and specification.

FIG. 2B shows an example circulant submatrix for an LDPC code, in accordance with some embodiments.

FIG. 4A shows an example layered decoding operation, in accordance with some embodiments.

FIG. 8A shows an example base matrix having multiple layers, in accordance with some embodiments.

FIG. 8B shows an example modification to the base matrix depicted in FIG. 9A, in accordance with some embodiments.

DETAILED DESCRIPTION

Figure 1:
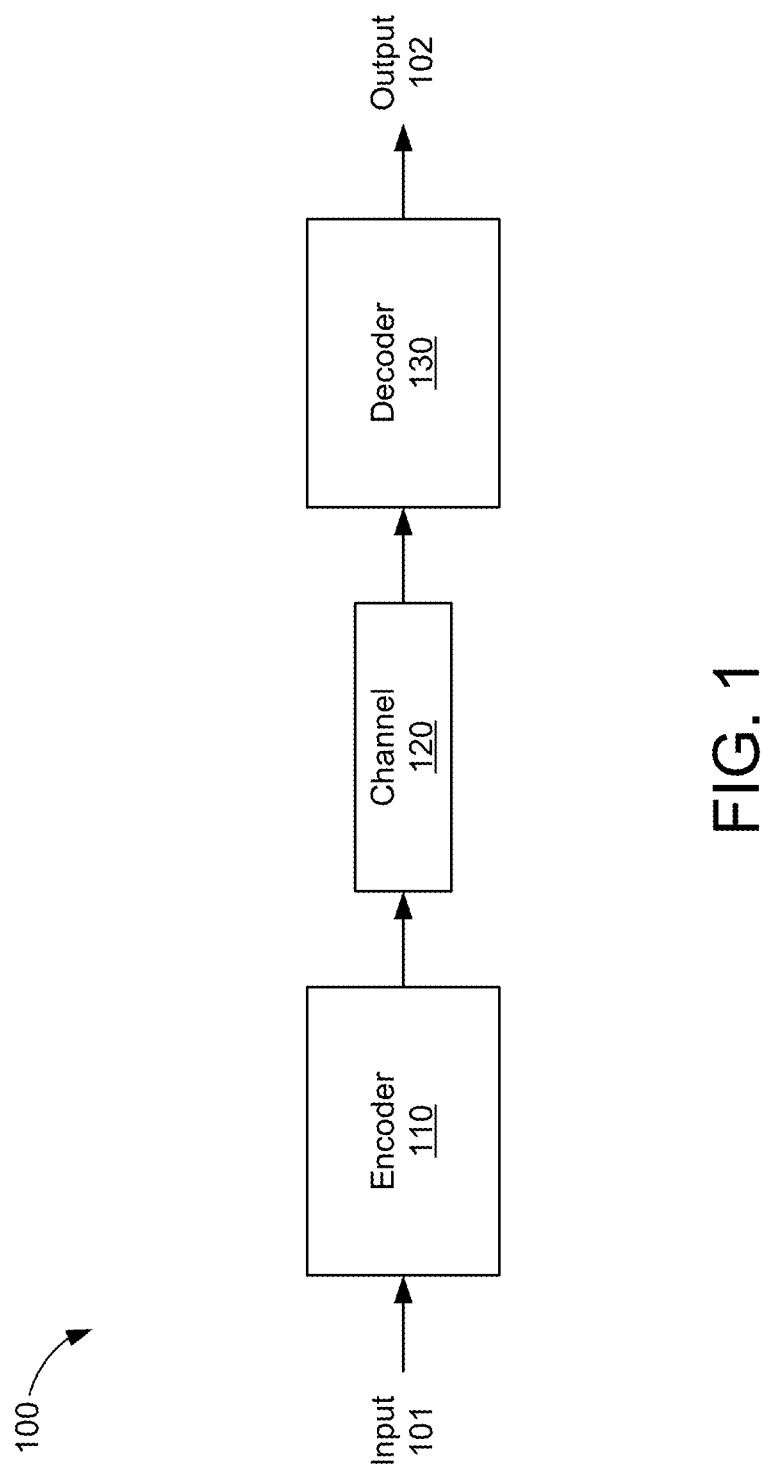
FIG. 1 is a block diagram of an example communication system, in accordance with some embodiments.

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example embodiments are not to be construed as limited to specific examples described herein but rather to include within their scope all embodiments defined by the appended claims.

Low-density parity-check (LDPC) codes are widely used in many communication standards. Some LDPC codes may use quasi-cyclic parity-check matrices for improved bit error rate. Such codes may be referred to as quasi-cyclic low-density parity-check (QC LDPC) codes. A parity check matrix for a QC LDPC code may be represented by a base matrix and expansion submatrices for expanding the elements of the base matrix. Some LDPC decoders may use a layered approach to decoding QC LDPC codes, for example, by updating soft bit information from layer to layer of the parity-check matrix. Each layer corresponds to a row of the base matrix, which may include a plurality of rows of an expansion submatrix. Each submatrix of a parity-check matrix may correspond to an all-zero matrix or a circulant matrix having a circulant weight equal to or greater than one. For a circulant matrix with a circulant weight of one, each row and column of the circulant matrix may contain only one non-zero element. Thus, the plurality of rows of the circulant matrix may be processed in parallel (or simultaneously) by an LDPC decoder.

Although an LDPC decoder may be capable of processing multiple rows of a circulant matrix in a single cycle, the number of cycles needed to process an entire layer of the base matrix (which may include a plurality of circulants) may be depend on the hardware resources of the decoder. For example, when decoding an LDPC codeword, the codeword may first be stored in a plurality of memory banks of the decoder circuit. More specifically, each "column" of data in the codeword may be stored in one of the memory banks (e.g., in a round-robin fashion based on the order of the columns in the codeword). The LDPC decoder may read selected columns from the memory banks (e.g., based on the arrangement of circulants in the parity-check matrix) to perform LDPC decoding on the codeword. However, the LDPC decoder may read only one column of data from each of the memory banks at a time (e.g., in parallel). Accordingly, the number of processing cycles needed to process a layer of the base matrix may depend on the order in which the columns of the codeword are stored in the memory banks.

Aspects of the present disclosure may improve the performance of an LDPC decoder circuit by reordering LDPC codewords in a way that maximizes the number of parallel decoding operations that may be performed by an LDPC decoder. In addition, or in the alternative, some LDPC decoder circuits disclosed herein may increase the number of LDPC decoding operations that may be performed in parallel without increasing the amount of memory needed to store the reordered codewords. In some embodiments, the decoder circuit may include a reordering stage to reordering the columns of a received codeword to change a memory bank assignment for one or more columns of the columns. More specifically, each column of the received codeword may be assigned to one of a plurality of memory banks based at least in part on an order of the columns in the received codeword. By reordering the columns of the received codeword, the reordering stage may pack the codeword into the memory banks in a way that maximizes the number of memory banks accessed during each cycle of the decoding operation, which in turn may increase the number of columns processed in parallel by the LDPC decoder.

In some embodiments, the reordering stage may add one or more additional columns to the received codeword to produce an extended codeword. In some aspects, the plurality of memory banks may be configured to store each column of the extended codeword. In this manner, the LDPC decoder may access the columns of the stored codeword in the same order for each layer of the decoding operation. In some other embodiments, the plurality of memory banks may be configured to store only the columns of the original codeword. In some aspects, the decoder circuit may include a first multiplexer to change an order of the columns in the reordered codeword when reading the reordered codeword from the memory banks to the LDPC decoder, and a second multiplexer to change an order of the columns in the decoded codeword when writing the decoded codeword from the LDPC decoder back to the memory banks. In this manner, the LDPC decoder may access the columns of the stored codeword in a different order for different layers of the decoding operation.

Although particular systems and methods are described herein for maximizing the number of parallel decoding operations that may be performed by an LDPC decoder, it is noted that the embodiments disclosed herein can also be used to improve the efficiency of LDPC encoding operations with little or no modification. For example, aspects of the present disclosure recognize that encoding operations may be performed (e.g., using a back-substitution process) with the same parity-check matrix (or at least a modified form of the parity-check matrix) used for decoding QC LDPC codes. Accordingly, the methods disclosed herein for reordering the columns of an LDPC codeword may also be used to maximize the number of parallel encoding operations that may be performed by an LDPC encoder.

FIG. 1 is a block diagram of an example communication system 100, in accordance with some embodiments. The communication system includes an encoder 110, a channel 120, and decoder 130. The encoder 110 and decoder 130 may be provided in respective communication devices such as, for example, computers, switches, routers, hubs, gateways, or other devices capable of transmitting and/or receiving communication signals. The channel 120 may be a wired or wireless communication link between the encoder 110 and the decoder 130.

The encoder 110 may receive an input 101 comprising message data to be transmitted to the decoder 130 via the channel 120. However, imperfections in the channel 120 may introduce channel distortion (e.g., linear distortion, multi-path effects, Additive White Gaussian Noise (AWGN), and/or other signal impairments). Thus, the encoder 110 may encode the input 101 prior to transmission. In some embodiments, the encoder 110 may encode the input 101 in accordance with an LDPC code so that error correction may be performed at the decoder 130. For example, the encoder 110 may generate an LDPC codeword as a result of the encoding. The LDPC codeword may be transmitted, over the channel 120, to the decoder 130. Upon receiving the LDPC codeword, the decoder 130 may use a parity-check matrix associated with the LDPC code to decode the received codeword. More specifically, the decoded codeword may be provided as an output 102 to the decoder 130. If channel 120 introduces errors (e.g., flipped bits) into the transmitted codeword, the decoder 130 may detect and correct such errors using the parity-check matrix.

Figure 2A:
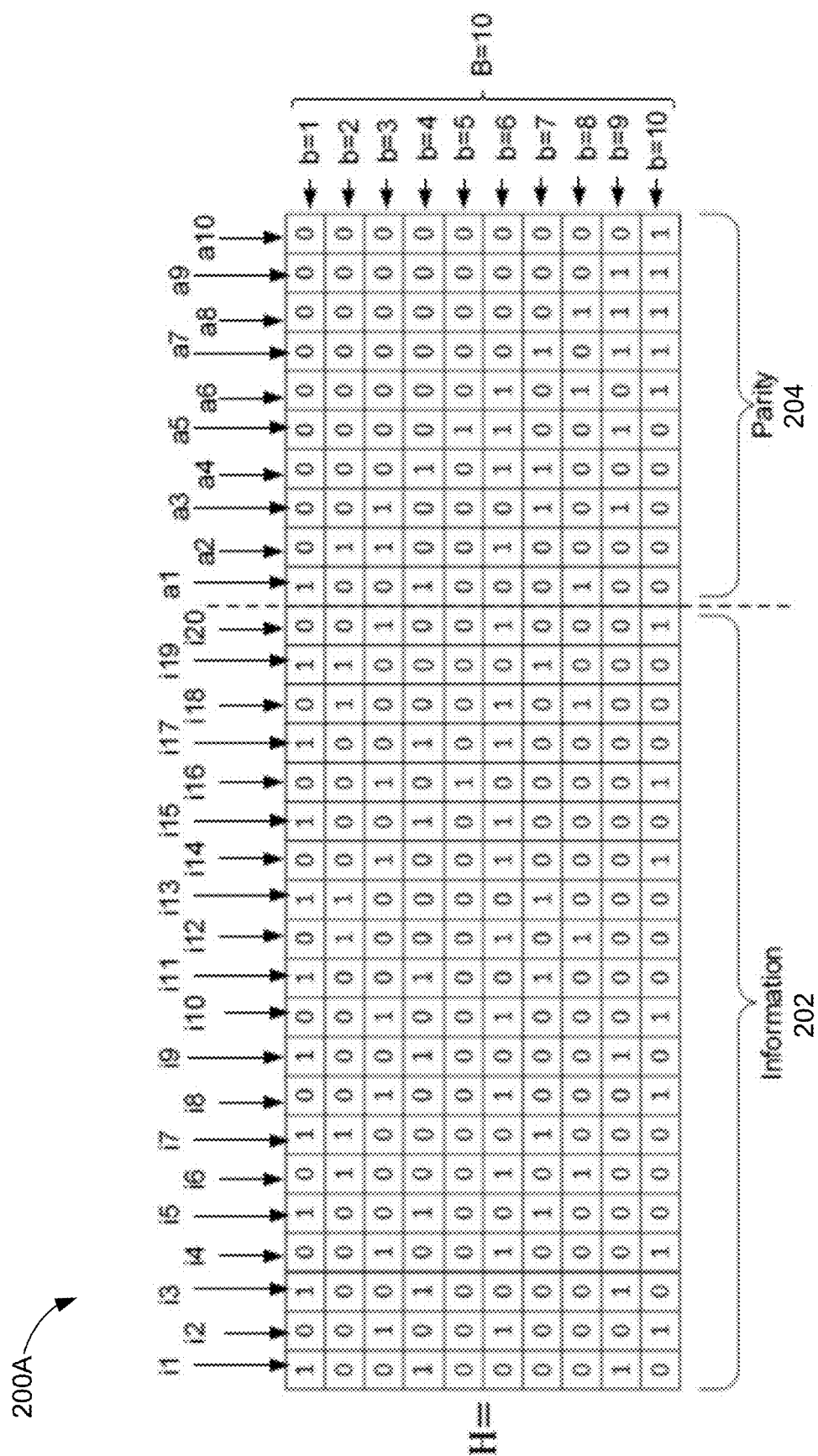
FIG. 2A shows an example parity-check matrix for a low-density parity-check (LDPC) code, in accordance with some embodiments.

FIG. 2A shows an example parity-check matrix 200A for a low-density parity-check (LDPC) code, in accordance with some embodiments. The parity check matrix 200A includes an information part 202 and a parity part 204. The information part 202 of the parity check matrix 200A includes information bits (e.g., information bits i1 through i20 for each row). The parity part 204 of the parity check matrix 200A includes parity bits (e.g., parity bits a1 through a10 for each row). With reference to FIG. 1, the parity-check matrix 200A may be used by the encoder 110 to encode an input 101 comprising 20 information bits to 30 codeword bits, for example, by adding 10 parity bits to the information bits. The decoder 130 may determine that a received codeword (c) is a valid codeword if the following condition is satisfied: $Hc^T=0$, where H represents the parity-check matrix 200A.

In some embodiments, the parity-check matrix 200A may correspond to a base matrix of a quasi-cyclic (QC) LDPC code. Each row of the base matrix may be referred to as a "layer," and may be assigned a particular layer index (b) based on the total number (B) of layers in the base matrix. In the example of FIG. 2A, the base matrix 200A is shown to have a total of 10 layers (e.g., B=10). Within a given layer, each column of the base matrix 200A (e.g., i1 through i20)

may comprise a submatrix. For example, each "0" in the parity-check matrix 200A may be expanded to an all-zero submatrix, and each "1" in the parity-check matrix 200A may be expanded to a circulant matrix having a circulant weight equal to or greater than 1. With reference for example to FIG. 2B, a circulant submatrix 200B is shown having a circulant weight equal to 1. Thus, each row and column of the circulant submatrix 200B contains only one non-zero element.

Figure 3:
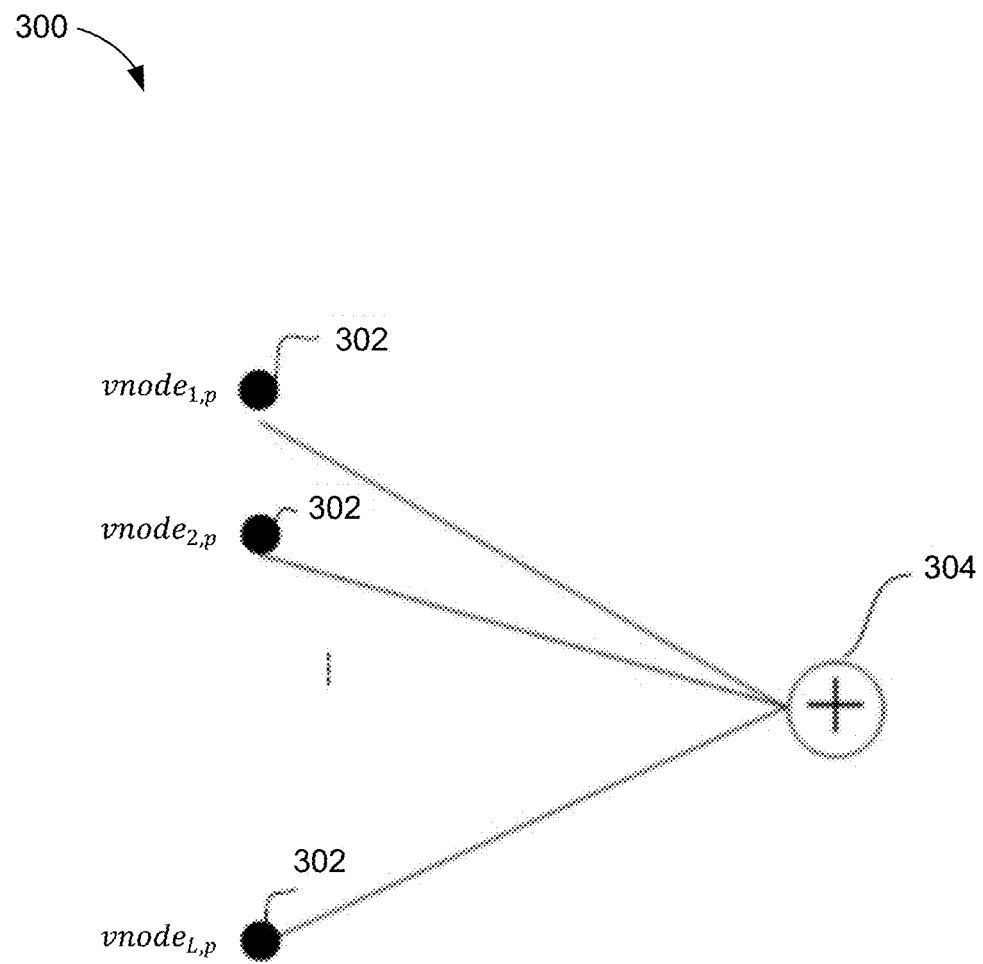
FIG. 3 shows an example bipartite graph representing a row of a parity-check matrix, in accordance with some embodiments.

FIG. 3 shows an example bipartite graph 300 representing a row of a parity-check matrix, in accordance with some embodiments. The bipartite graph 300 (which may also be referred to as a Tanner graph) includes a set of variable nodes 302 ($vnode_{1,p}$-$vnode_{L,p}$) and a check node 304. The "edges" (e.g., lines) in the bipartite graph 300 connect the variable nodes 302 to the check node 304. More specifically, $vnode_{l,p}$ denotes the $l^{th}$ variable node 302 that participates in the $p^{th}$ row of the parity-check matrix, where L is the total number of non-zero bits in the $p^{th}$ row of the parity-check matrix. With reference for example to FIG. 2A, there are 11 bits (or columns) that participate in the parity-check operation associated with the first row (or layer) of the parity-check matrix 200A, thus L=11.

An LDPC decoder may decode a received codeword (c) by exchanging messages within the bipartite graph 300, along the edges, and updating these messages by performing computations at the nodes based on the incoming messages. For example, each variable node 302 in the graph 300 may initially be provided with a "soft bit" (e.g., representing the received bit of the codeword) that indicates an estimate of the associated bit's value as determined by observations from the communications channel. Using these soft bits, the LDPC decoder may update messages by iteratively reading them (or some portion thereof) from memory and writing an updated message (or some portion thereof) back to memory. The update operations are typically based on the parity check constraints of the corresponding LDPC code. For example, the LDPC decoder may update the soft bits associated with the codeword c to satisfy the equation: $h_p c^T = 0$, where $h_p$ is the $p^{th}$ row of the parity-check matrix.

FIG. 4A shows an example layered decoding operation 400A, in accordance with some embodiments. As shown in FIG. 4A, each $b^{th}$ layer of a corresponding parity-check matrix (H) contains the rows $P \cdot (b-1)+1$ to $P \cdot b$, thus each $b^{th}$ layer has a row weight $L_b$. In the layered decoding operation 400A, P denotes the size (e.g., number of rows) of a circulant submatrix in the parity-check matrix H, and B denotes the number of layers in the parity-check matrix H (e.g., B=(N−K)/P). Furthermore, $v_{l,p}^b$, denotes the log-likelihood ratio (LLR) of the $l^{th}$ variable node $vnode_{l,p}^b$ in the $p^{th}$ row of the $b^{th}$ layer of the parity-check matrix, and $V_{l,p}$ denotes the set of LLRs for all of the variable nodes $vnode_{l,p}^b$ that participate in the $p^{th}$ row of the $b^{th}$ layer of the parity-check matrix excluding $v_{l,p}$ (e.g., $$V_{l,p}^b = \frac{V_{l,p}}{v_{l,p}^b}).$$

The messages exchanged between check nodes and variable nodes are represented as "updates," where $upd\_vnode_{l,p}^b$ denotes the update to the variable node $vnode_{l,p}^b$ in the $p^{th}$ row of the $b^{th}$ layer of the parity-check matrix.

In some embodiments, a variable update rule of the layered decoding operation 400A may use a belief propagation algorithm. A belief propagation algorithm may include, for example, a sum-product algorithm, a min-sum algorithm, a scaled min-sum algorithm, a variable scaled min-sum algorithm, and any other suitable belief propagation algorithms. The examples described herein use a scaled min-sum algorithm for illustrative purposes only. In some embodiments, the variable node update rule may perform lines 2 through 12 of the layered decoding operation 400A for each $b^{th}$ layer by processing the P consecutive rows of that layer.

Figure 4B:
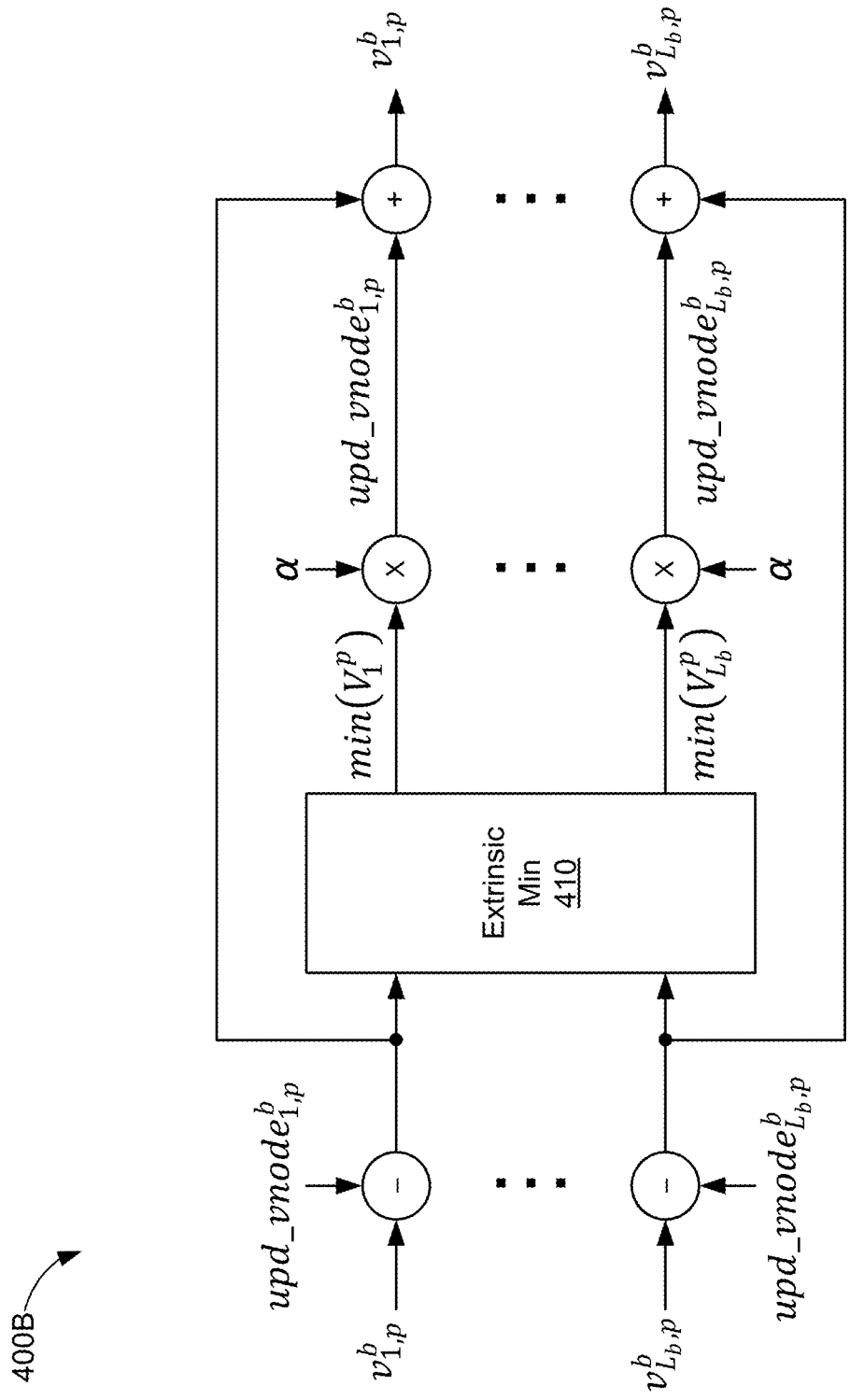
FIG. 4B is a block diagram of an example row processing unit for an LDPC decoder, in accordance with some embodiments.

FIG. 4B is a block diagram of an example row processing unit 400B for an LDPC decoder, in accordance with some embodiments. With reference for example to FIG. 4A, the row processing unit 400B may be configured to process and/or execute lines 3 through 11 of the layered decoding operation 400A for the $p^{th}$ row of the $b^{th}$ layer of a corresponding parity-check matrix. The row processing unit 400B receives, as its inputs, LLR values v, through $v_{1,p}^b$ (for $vnode_{1,p}^b$ through $vnode_{L_b,p}^b$, respectively). In some aspects, the LLR values $v_{l,p}^b$, may be obtained from a previous update (e.g., from another layer). Thus, the row processing unit 400B may first subtract the corresponding check node messages $upd\_vnode_{1,p}^b$ through $upd\_vnode_{L_b,p}^b$ from the LLR values $v_{1,p}^b$ through $v_{L_b,p}^b$, respectively (e.g., as described in line 4 of the layered decoding operation 400A).

An extrinsic minimum generator 410 may compute the extrinsic minimum values of the LLRs $v_{l,p}^b$ for each variable node index l, from 1 to $L_b$ (e.g., by computing $min(|V_l^P|)$ $\Pi sign(V_l^P)$ as described in line 7 of the layered decoding operation 400A). In the example of FIG. 4B, a scalar (α) is applied to the extrinsic minimum values $min(V_1^P)$ through $min(V_l^P)$ to generate scaled extrinsic minimum values, which correspond to updates $upd\_vnode_p$ through $upd\_vnode_{L_b,p}^b$ for the current layer being processed. The updates $upd\_vnode_{1,p}^b$ through $upd\_vnode_{L_b,p}^b$ are added to the LLR values $v_{1,p}^b$ through $v_{L_b,p}^b$, respectively, to produce updated LLR values $v_{l,p}^b$ (e.g., as described in line 10 of the layered decoding operation 400A) at the output of the row processing unit 400B. The updated LLR values $v_{1,p}^b$ through $v_{L_b,p}^b$ may then be stored in memory (not shown for simplicity), and may be used in a subsequent update of the layered decoding operation 400A.

It is noted that, the example row processing unit 400B may be scaled to simultaneously process P consecutive rows of a given layer of the parity-check matrix, for example, by operating a number (P) of the row processing units 400B in parallel. For example, a decoder architecture with 128 processors may be able to process one circulant having a size of up to P=128 per cycle. More specifically, it may take the decoder $L_b$ cycles to complete a single layer if P=128. However, if P≤64, the decoder may process up to 2 circulants in parallel per cycle. Further, if P≤32, the decoder may process up to 4 circulants in parallel per cycle. Thus, the number of parallel operations that may be performed by the decoder increases as the size of the circulant submatrix decreases, allowing a layer to be completed in less than $L_b$ cycles.

Although an LDPC decoder may be capable of processing multiple circulants in a single cycle, the number of cycles needed to process a layer of the base matrix may still depend on other hardware limitations of the decoder circuit. For example, an LDPC codeword may be stored, in memory, across multiple memory banks. Each "column" of the LDPC codeword (which may correspond to a respective circulant of the base matrix of the LDPC code) may be stored in one of the memory banks (e.g., in a round-robin fashion based on the order or position of each column in the corresponding codeword). The LDPC decoder may read selected columns from the memory banks (e.g., based on the arrangement of circulants in the parity-check matrix) to perform LDPC decoding on the codeword. However, the LDPC decoder may read only one column of data from each of the memory banks at a time (e.g., in parallel). Accordingly, the number of processing cycles needed to process a layer of the base matrix may depend on which columns of the codeword are stored in each of the memory banks.

Figure 5A:
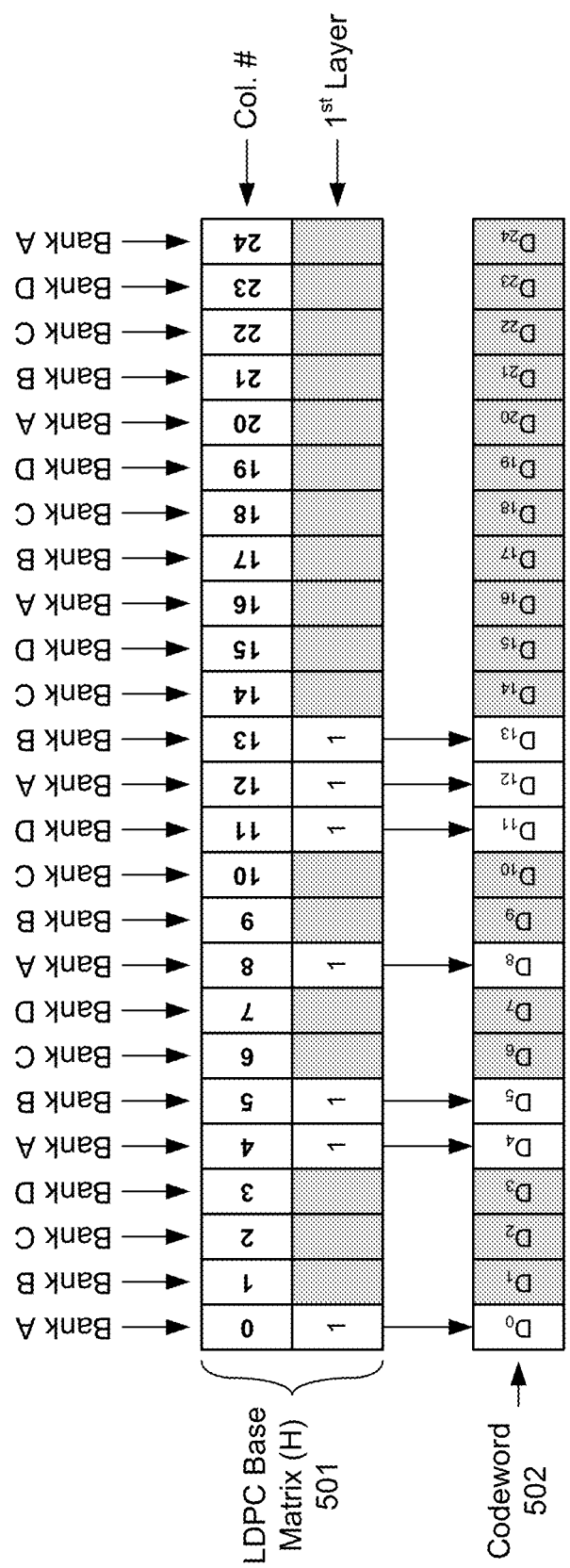
FIG. 5A shows an example base matrix for an LDPC code and an associated codeword, in accordance with some embodiments.

FIG. 5A shows an example base matrix (H) 501 for an LDPC code and an associated codeword 502, in accordance with some embodiments. In some embodiments, the base matrix 501 may be associated with a QC LDPC code. In the example of FIG. 5A, only the first layer of the base matrix 501 is shown for simplicity. However, in actual implementations, the base matrix 501 may include more layers than those depicted in FIG. 5A. Each layer of the base matrix 501 is further subdivided into 25 columns (e.g., columns 0-24), and each column within a given layer may correspond with an all-zero submatrix (depicted as blank or empty rectangles) or a circulant submatrix (depicted as rectangles storing a value of "1"). As described above with respect to FIGS. 2A and 2B, an all-zero submatrix may be a P×P matrix in which all of the values are 0, and a circulant submatrix may be a P×P matrix in which each row and column contains a number of 1's equal to its circulant weight.

The codeword 502 may be encoded based on the QC LDPC code associated with the base matrix 501. Data in the codeword 502 may be arranged in a plurality of columns $D_0$-$D_{24}$. More specifically, each column of data (herein referred to as a "column") in the codeword 502 may be associated with a corresponding column of the base matrix 501. For example, columns 0 through 24 of the base matrix 501 may correspond with columns $D_0$ through $D_{24}$, respectively, of the codeword 502. As shown in FIG. 5A, only selected columns of the codeword 502 participate in the decoding operation for each layer of the base matrix 501. The selected columns of the codeword 502 may coincide with respective column positions of circulant submatrices in the base matrix 501. For example, the first layer of the base matrix 501 includes a total of 7 circulant matrices located in columns 0, 4, 5, 8, 11, 12, and 13. Thus, only columns $D_0$, $D_4$, $D_5$, $D_8$, $D_{11}$, $D_{12}$, and $D_{13}$ of the codeword 502 may participate in the first layer of decoding.

Figures 5B, 5C:
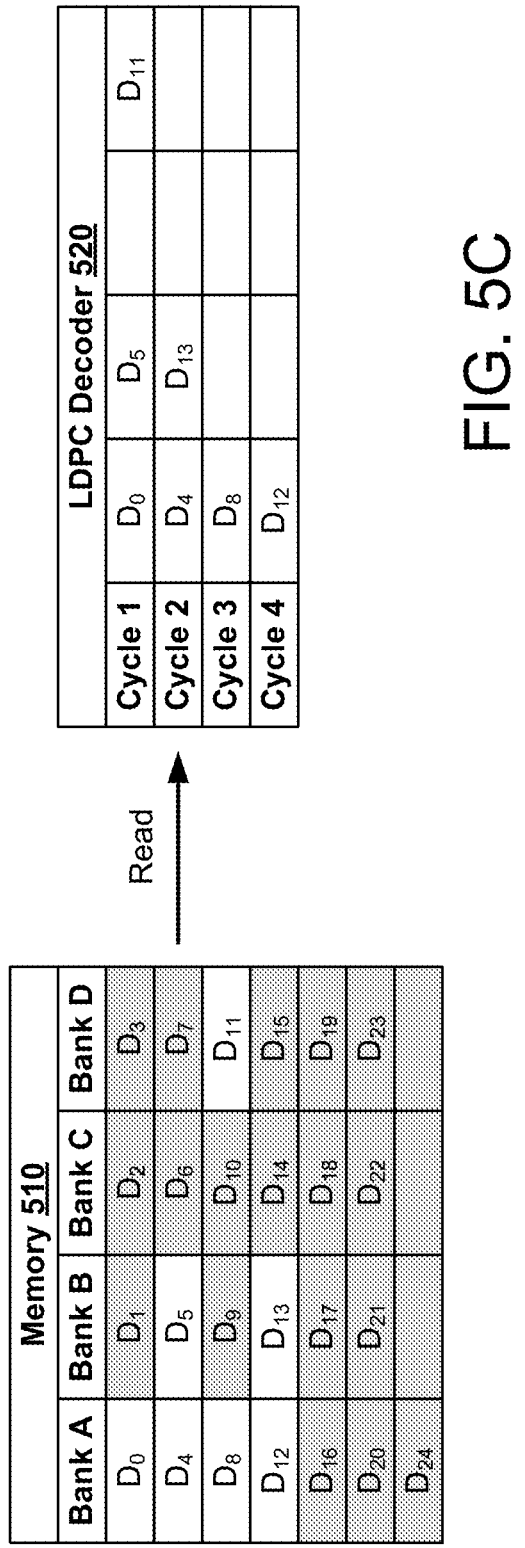
FIG. 5B shows an example memory configured to store the LDPC codeword depicted in FIG. 5A, in accordance with some embodiments.
FIG. 5C shows an example LDPC decoder configured to process codewords stored in the memory depicted in FIG. 5B, in accordance with some embodiments.

FIG. 5B shows an example memory 510 configured to store the LDPC codeword 502 depicted in FIG. 5A, in accordance with some embodiments. The memory 510 may include a plurality of memory banks A-D. In the example of FIG. 5B, only 4 memory banks A-D are shown for simplicity. However, in actual implementations, the memory 510 may include fewer or more memory banks than those depicted in FIG. 5B.

Each of the memory banks A-D may be configured to store one or more columns of the codeword 502. In some embodiments, each of the columns $D_0$-$D_{24}$ may be assigned to one of the memory banks A, B, C, or D based on an order of the columns in the codeword 502. For example, each of the columns $D_0$-$D_{24}$ may be stored upon receipt by the memory 510. Thus, the first four columns $D_0$, $D_1$, $D_2$, and $D_3$ may be assigned to memory banks A, B, C, and D, respectively. Thereafter, every four consecutive columns of the codeword 502 may be assigned to one of the memory banks A, B, C, or D in a round-robin fashion (e.g., as shown in FIG. 5A). In the example of FIG. 5B, memory bank A stores columns $D_0$, $D_4$, $D_8$, $D_{12}$, $D_{16}$, $D_{20}$, and $D_{24}$, memory bank B stores columns $D_1$, $D_5$, $D_9$, $D_{13}$, $D_{17}$, and $D_{21}$, memory bank C stores columns $D_2$, $D_6$, $D_{10}$, $D_{14}$, $D_{18}$, and $D_{22}$, and memory bank D stores columns $D_3$, $D_7$, $D_{11}$, $D_{15}$, $D_{19}$, and $D_{23}$.

FIG. 5C shows an example LDPC decoder 520 configured to process codewords stored in the memory 510 depicted in FIG. 5B, in accordance with some embodiments. The LDPC decoder 520 may be configured to read selected columns form the memory 510, and perform LDPC decoding on the selected columns using a layered decoding operation (e.g., as described above with respect to FIGS. 4A and 4B).

In some embodiments, the LDPC decoder 520 may access the plurality of memory banks A-D in parallel. However, the LDPC decoder 520 may read only one column from each of the memory banks A-D at a given time. For example, during each cycle of the layered decoding operation, the LDPC decoder 520 may read up to one column from each of the memory banks A, B, C, and D. As shown in FIG. 5A, only columns $D_0$, $D_4$, $D_5$, $D_8$, $D_{11}$, $D_{12}$, and $D_{13}$ of the codeword 502 participate in the first layer of decoding. Moreover, as shown in FIG. 5B, columns $D_0$, $D_4$, $D_8$, and $D_{12}$ are stored in memory bank A, columns $D_5$ and $D_{13}$ are stored in memory bank B, and column $D_{11}$ is stored in memory bank D. Thus, the LDPC decoder 520 may read columns $D_0$, $D_5$, and $D_{11}$ from memory banks A, B, and D, respectively, during a first cycle of operation. The LDPC decoder 520 may read columns $D_4$ and $D_{13}$ from memory banks A and B, respectively, during a second cycle of operation. Since the remainder of the selected columns ($D_8$ and $D_{12}$) are all stored in memory bank A, the LDPC decoder 520 may read column $D_8$ during a third cycle of operation, and may read column $D_{12}$ during a fourth cycle of operation.

In the example of FIG. 5C, the LDPC decoder 520 may require four cycles to complete the first layer of decoding. Specifically, the number of cycles is limited by the number of columns stored in memory bank A that participate in the first layer of decoding. It is noted, however, that memory bank C does not store any of the columns that participate in the first layer of decoding. Thus, the number of cycles needed to complete the first layer of decoding may be reduced by moving one or more of the selected columns $D_0$, $D_4$, $D_8$, or $D_{12}$ from memory bank A to another memory bank (such as memory bank C or D). For example, moving columns $D_8$ and $D_{12}$ to memory bank C would substantially equalize the distribution of the selected columns across each of the memory banks A-D (e.g., memory banks A-C would each store 2 of the selected columns, and memory bank D would store 1 of the selected columns). This, in turn, would maximize the number of memory banks from which the LDPC decoder 520 may read during each cycle, and thus maximize the number of parallel decoding operations performed by the LDPC decoder 520 per cycle.

As described above, the memory 510 may be configured to store the columns of an LDPC codeword based, at least in part, on an order in which the columns are arranged in the received codeword. Thus, aspects of the present disclosure may improve the performance of an LDPC decoder circuit by reordering the columns of a received codeword to change the memory bank assignment for one or more of the columns. More specifically, the reordered codeword may be stored in a manner that maximizes the number of memory banks from which the LDPC decoder reads per cycle (thereby maximizing the number of parallel operations that may be performed by the decoder each cycle).

Figure 6:
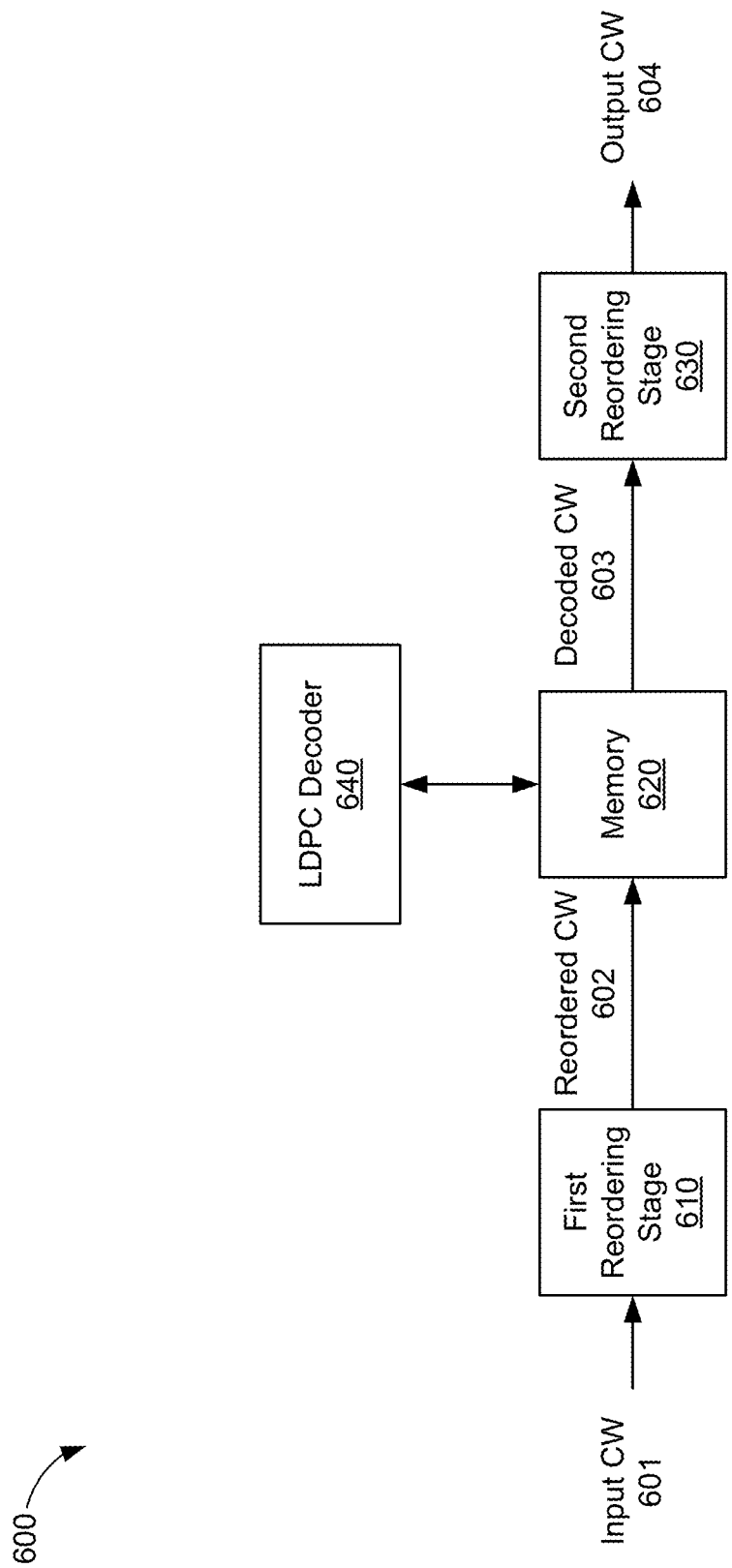
FIG. 6 is a block diagram of an example decoder circuit, in accordance with some embodiments.

FIG. 6 is a block diagram of an example decoder circuit 600, in accordance with some embodiments. The decoder circuit 600 includes a first reordering stage 610, a memory 620, a second reordering stage 630, and an LDPC decoder 640. The decoder circuit 600 is configured to receive an input codeword (CW) 601, and to generate an output codeword 604 based on an LDPC decoding operation. For example, the decoder circuit 600 may decode the input codeword 601 in accordance with an LDPC code to detect and/or correct any errors that may have been introduced into the input codeword 601 by a communication channel. The LDPC code used to decode the input codeword 601 may be the same as the LDPC code used by an encoder circuit (not shown for simplicity) to encode the codeword 601. In some embodiments, the LDPC code may be a QC LDPC code.

The input codeword 601 may include data arranged in a plurality of columns. The memory 620 may include a plurality of memory banks to store the columns of the input codeword 601. As described above with respect to FIGS. 5A and 5B, each column of the input codeword 601 may be assigned to one of the plurality of memory banks in the memory 620 based, at least in part, on an order of the columns in the codeword 601. For example, each successive column may be assigned to a different memory bank (e.g., in a round-robin fashion). The first reordering stage 610 may be configured to reorder one or more columns of the input codeword 601. In some embodiments, the first reordering stage 610 may reorder the columns of the input codeword 601 to change a memory bank assignment for one or more of the columns (e.g., from an initial memory bank assignment). Accordingly, the first reordering stage 610 may generate a reordered codeword 602 (e.g., based on the input codeword 601) to be stored in memory 620.

In an example, the input codeword 601 may correspond to the codeword 502 of FIG. 5A. As described above with respect to FIG. 5B, each of the columns $D_0$-$D_{24}$ of the codeword 502 may be initially assigned to one of the memory banks A-D (e.g., in a round-robin fashion) based on an order in which the columns $D_0$-$D_{24}$ are received by the decoder circuit 600 (e.g., at the first reordering stage 610). However, as shown in FIG. 5C, storing the columns in this order results in an inefficient use of memory and processing resources when processing a first layer of the decoding operation. Thus, the first reordering stage 610 may reorder the columns of the codeword 502 to change the memory bank assignment for one or more of the columns participating in the first layer of decoding (e.g., columns $D_0$, $D_4$, $D_5$, $D_8$, $D_{11}$, $D_{12}$, or $D_{13}$). It is noted, however, that reordering the columns of the codeword 502 may also require reordering the columns of the base matrix 501 (e.g., since the locations of circulant submatrices in the base matrix 501 determine which columns of the codeword 502 participate in the decoding operation). Thus, in some embodiments, the first reordering stage 610 may reorder the columns of the input codeword 601 based, at least in part, on one or more modifications to a base matrix associated with the input codeword 601.

Figure 7A:
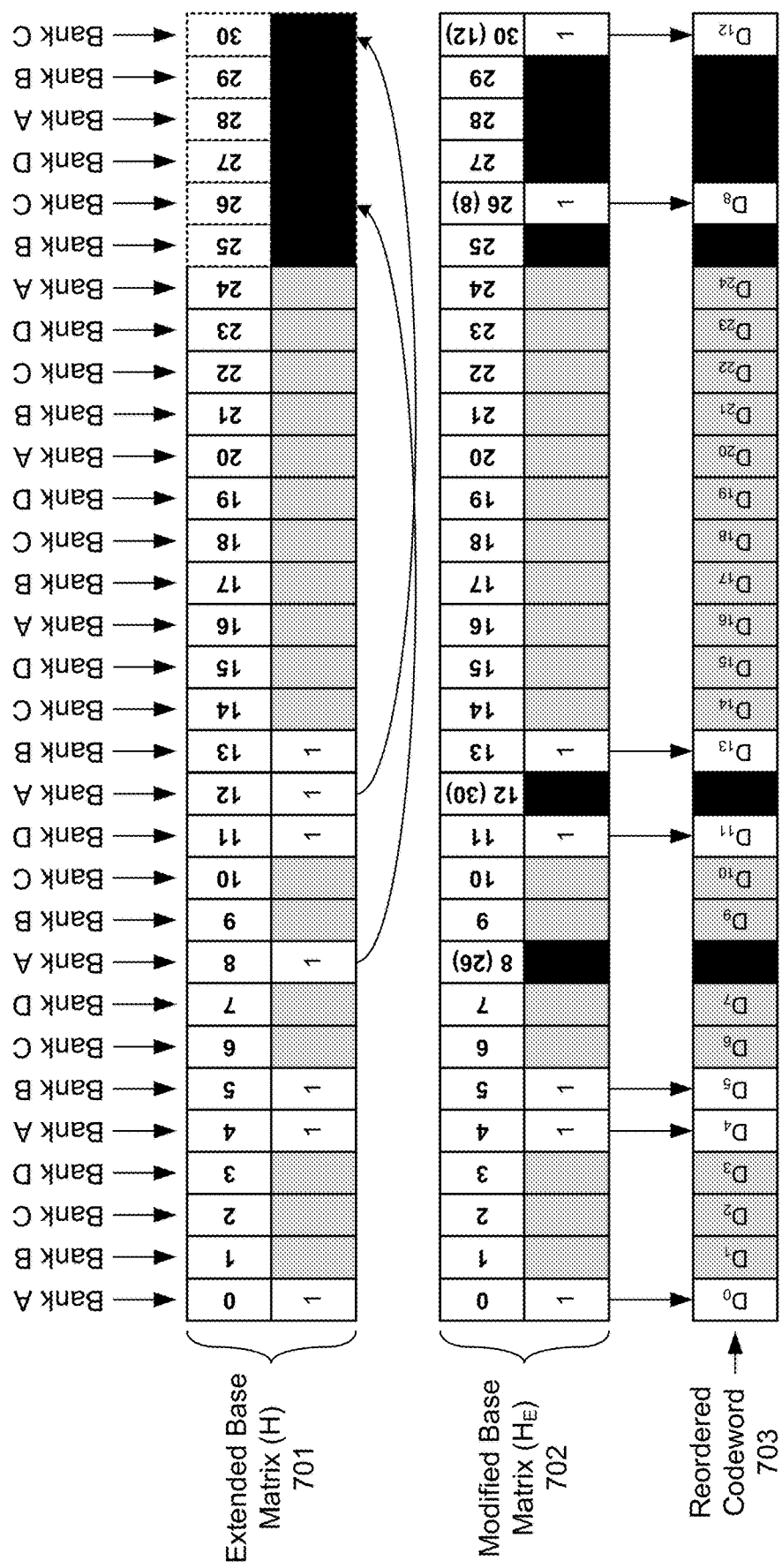
FIG. 7A shows an example modification to the base matrix depicted in FIG. 5A, in accordance with some embodiments.

With reference for example to FIG. 7A, one or more additional columns 25-30 may be appended to the base matrix 501 to produce an extended base matrix 701. In some embodiments, each of the additional columns 25-30 (shown as a blacked-out rectangle) may correspond to an all-zero submatrix (e.g., or a submatrix having NULL data values). A modified base matrix ($H_E$) 702 may be generated by changing an order of the columns 0-30 of the extended base matrix 701. In the example of FIG. 7A, the modified base matrix 702 is produced by swapping column 8 with column 26 of the extended base matrix 701, and by swapping column 12 with column 30 of the extended base matrix 701. Thus, the circulant submatrix previously residing in column 8 of the original base matrix 501 is relocated to column 26 of the modified base matrix 702, and the circulant submatrix previously residing in column 12 of the original base matrix 501 is relocated to column 30 of the modified base matrix 702.

In some aspects, the first reordering stage 610 may reorder the columns of the original codeword 502, according to the modified base matrix 702, to produce a reordered codeword 703. As shown in FIG. 7A, the order of the first eight columns $D_0$-$D_7$ of the reordered codeword 703 remains unchanged (e.g., columns $D_0$-$D_7$ are still located in columns positions 0-7). However, column $D_8$ (which was in the ninth column position of the original codeword 502) has been moved to the twenty-seventh column position of the reordered codeword 703. In some embodiments, a set of NULL (or zero) data values may be inserted in the place of the ninth column position of the reordered codeword 703. The next three columns $D_9$-$D_{11}$ of the reordered codeword 703 remain unchanged from their original column positions. However, column $D_{12}$ (which was in the thirteenth column position of the original codeword 502) has been moved to the thirtieth column position of the reordered codeword 703. In some embodiments, a set of NULL (or zero) data values may be inserted in the place of the thirteenth columns position of the reordered codeword 703. The remaining columns $D_{13}$-$D_{24}$ of the reordered codeword 703 also remain unchanged from their original column positions. In the example of FIG. 7A, NULL (or zero) data values may be used to fill the remaining (e.g., extra) column positions 25 and 27-29 of the reordered codeword 703.

In the example described above, the reordered codeword 703 may correspond to the reordered codeword 602 of FIG. 6. It is noted that, as a result of the reordering, column $D_8$ (originally assigned to memory bank A) has been reassigned to memory bank C due its new position (e.g., column position 26) in the reordered codeword 703. Furthermore, column $D_{12}$ (originally assigned to memory bank A) has also been reassigned to memory bank C due its new position (e.g., column position 30) in the reordered codeword 703.

Figures 7B, 7C:
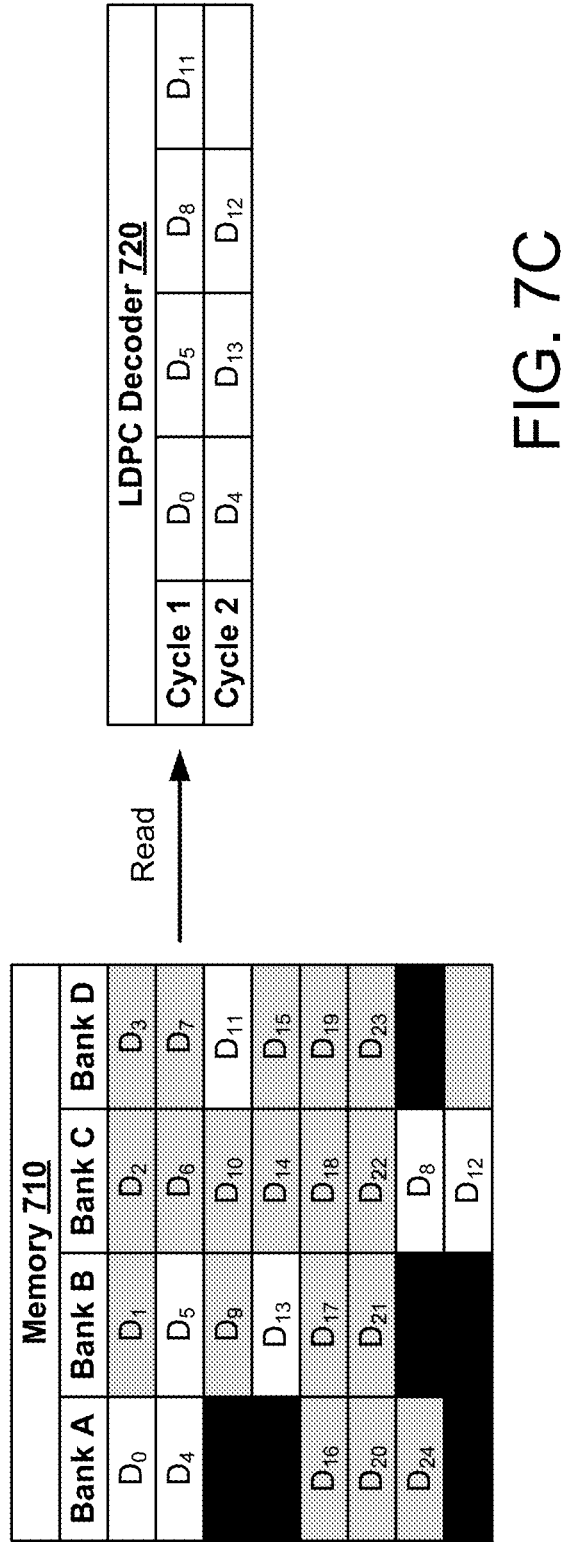
FIG. 7B shows an example memory configured to store the reordered codeword depicted in FIG. 7A, in accordance with some embodiments.
FIG. 7C shows an example LDPC decoder configured to process codewords stored in the memory depicted in FIG. 7B, in accordance with some embodiments.

FIG. 7B shows an example memory 710 configured to store the reordered LDPC codeword 703 depicted in FIG. 7A, in accordance with some embodiments. The memory 710 may be an example embodiment of the memory 510 of FIG. 5 and/or memory 620 of FIG. 6. In some embodiments, each of the columns $D_0$-$D_{30}$ may be assigned to one of the memory banks A, B, C, or D based on an order of the columns in the reordered codeword 703. More specifically, as described with respect to FIG. 5B, every four consecutive columns of the reordered codeword 703 may be assigned to one of the memory banks A, B, C, or D in a round-robin fashion (e.g., as shown in FIG. 7A). Thus, in the example of FIG. 7B, memory bank A stores columns $D_0$, $D_4$, $D_{16}$, $D_{20}$, and $D_{24}$, memory bank B stores columns $D_1$, $D_5$, $D_9$, $D_{13}$, $D_{17}$, and $D_{21}$, memory bank C stores columns $D_2$, $D_6$, $D_{10}$, $D_{14}$, $D_{18}$, $D_{22}$, $D_8$, and $D_{12}$, and memory bank D stores columns $D_3$, $D_7$, $D_{11}$, $D_{15}$, $D_{19}$, and $D_{23}$.

FIG. 7C shows an example LDPC decoder 720 configured to process codewords stored in the memory 710 depicted in FIG. 7B, in accordance with some embodiments. The LDPC decoder 720 may be an example embodiment of the LDPC decoder 520 of FIG. 5 and/or LDPC decoder 640 of FIG. 6. In some embodiments, the LDPC decoder 720 may implement a layered decoding operation by accessing the plurality of memory banks A-D in parallel. However, as described with respect to FIG. 5C, the LDPC decoder 720 may read up to one column from each of the memory banks A, B, C, and D during each cycle of the layered decoding operation. As shown in FIG. 7A, only columns $D_0$, $D_4$, $D_5$, $D_8$, $D_{11}$, $D_{12}$, and $D_{13}$ of the codeword 502 participate in the first layer of decoding. Moreover, as shown in FIG. 7B, columns $D_0$ and $D_4$ are stored in memory bank A, columns $D_5$ and $D_{13}$ are stored in memory bank B, columns $D_8$ and $D_{12}$ are stored in memory bank C, and column $D_{11}$ is stored in memory bank D. Thus, the LDPC decoder 720 may read columns $D_0$, $D_5$, $D_8$, and $D_{11}$ from memory banks A, B, C, and D, respectively, during a first cycle of operation. Further, the LDPC decoder 720 may read columns $D_4$, $D_{13}$, and $D_{12}$ from memory banks A, B, and C, respectively, during a second cycle of operation.

In the example of FIG. 7C, the LDPC decoder 720 requires only two cycles to complete the first layer of decoding (e.g., compared to four cycles needed by the LDPC decoder 520 of FIG. 5C). More specifically, the reordering of columns $D_8$ and $D_{12}$ in the reordered codeword 703 results in a substantially equalized distribution of the selected columns $D_0$, $D_4$, $D_5$, $D_8$, $D_{11}$, $D_{12}$, and $D_{13}$ (e.g., the columns participating in the first layer of the decoding operation) across the different memory banks A-D. This allows the LDPC decoder 720 to access the maximum number of memory banks available per cycle of the layered decoding operation, thereby maximizing the number of parallel decoding operations performed each cycle. As a result, the total number of cycles needed to complete a layer of the decoding operation is halved.

When the layered decoding operation is completed, the second reordering stage 630 may retrieve a decoded codeword 603 from memory 620 and may reorder one or more columns of the decoded codeword 603 to produce the output codeword 604. In some embodiments, the second reordering stage 630 may be configured to "reverse" the reordering performed by the first reordering stage 610 so that the output codeword 604 substantially tracks the input codeword 601. More specifically, the second reordering stage 630 may read the columns from memory 620 in an order in which the columns were originally received at the input of the first reordering stage 610. With reference for example to FIG. 7B, the second reordering stage 630 may read out the columns $D_0$-$D_{24}$ from memory 710, in that order, while ignoring (or removing) any additional columns added by the first reordering stage 610. As a result, the output codeword 604 may look substantially similar to the codeword 502 of FIG. 5A (albeit with updated values for one or more of the columns $D_0$-$D_{24}$).

FIGS. 7A-7C illustrate an example reordering operation that may be used to optimize the number of parallel decoding operations performed for a single layer of decoding. It is noted, however, that many QC LDPC codes have base matrices with multiple layers. Moreover, changing an order of one or more columns of the base matrix may affect the locations of circulant submatrices across multiple layers of the base matrix. Thus, reordered codewords may be longer and more complex for base matrices with more layers.

The first reordering stage 610 and/or the second reordering stage 630 may be implemented in hardware, software, firmware, or any combination thereof. In some aspects, the first and second reordering stages 610 and 630 may be implemented together in an integrated logic device. In other aspects, the first and second reordering stages 610 and 630 may be implemented separately, as discrete but interoperable logic devices. If implemented in software, the reordering operations may be realized at least in part by a non-transitory processor-readable storage medium storing instructions that, when executed by a processor, performs one or more of the operations described above. The term "processor," as used herein, may refer to any general purpose processor, conventional processor, controller, microcontroller, and/or state machine capable of executing scripts or instructions of one or more software programs stored in memory.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The reordering operations additionally, or alternatively, may be realized at least in part by a processor-readable communication medium that carries or communicates code in the form of instructions or data structures and that can be accessed, read, and/or executed by a computer or other processor.

FIG. 8A shows an example base matrix (H) 801 having multiple layers, in accordance with some embodiments. For example, the base matrix 801 may be associated with a QC LDPC code. In some embodiments, the base matrix 801 may correspond to an original base matrix for the N=648 rate ½ LDPC code used in Wi-Fi communications (e.g., as defined by the IEEE 802.11 standards). In the example of FIG. 8A, the base matrix 801 includes twelve layers (e.g., layers 0-11). Each layer of the base matrix 801 is further subdivided into twenty-three columns (e.g., columns 0-23), and each column within a given layer may correspond with an all-zero submatrix (depicted as blank or empty rectangles) or a circulant submatrix (depicted as rectangles storing a value of "1"). As described above with respect to FIGS. 2A and 2B, an all-zero submatrix may be a P×P matrix in which all of the values are 0, and a circulant submatrix may be a P×P matrix in which each row and column contains a number of 1's equal to its circulant weight.

A decoder circuit may receive an LDPC codeword encoded based on the QC LDPC code associated with the base matrix 801 and may store the received codeword in a plurality of memory banks A-D (not shown for simplicity). More specifically, each column of the received codeword may be assignment to one of the memory banks A, B, C, or D (e.g., in a round-robin fashion) based on an order of the columns in the received codeword. For example, each column of the received codeword may be associated with a corresponding column of the base matrix 801. However, only selected columns of the codeword may participate in the decoding operation for each layer of the base matrix 801. The selected columns may coincide with respective column positions of circulant submatrices in the base matrix 801.

Table 1 shows an example packing of a received codeword (e.g., into four memory banks A-D) based on the memory bank assignment associated with the original configuration of the base matrix 801, as depicted in FIG. 8A.

TABLE 1

| Layer | # Columns Participating from Bank A | # Columns Participating from Bank B | # Columns Participating from Bank C | #Columns Participating from Bank D | # Decoding Cycles Per Layer |
| --- | --- | --- | --- | --- | --- |
| 0 | 4 | 2 | 0 | 1 | 4 |
| 1 | 3 | 2 | 2 | 1 | 3 |
| 2 | 3 | 0 | 3 | 1 | 3 |
| 3 | 4 | 1 | 0 | 2 | 4 |
| 4 | 4 | 1 | 1 | 0 | 4 |
| 5 | 3 | 1 | 3 | 1 | 3 |
| 6 | 4 | 1 | 1 | 1 | 4 |
| 7 | 4 | 1 | 1 | 1 | 4 |

TABLE 1-continued

| Layer | # Columns Participating from Bank A | # Columns Participating from Bank B | # Columns Participating from Bank C | #Columns Participating from Bank D | # Decoding Cycles Per Layer |
|---|---|---|---|---|---|
| 8 | 4 | 3 | 0 | 1 | 4 |
| 9 | 3 | 1 | 2 | 1 | 3 |
| 10 | 3 | 1 | 2 | 2 | 3 |
| 11 | 4 | 1 | 0 | 2 | 4 |
| | | | | Total: | 43 |

In the example packing configuration above, an LDPC decoder accesses memory bank A more frequently than any of the other memory banks B, C, or D when processing each layer of the base matrix 801. Thus, as shown in Table 1, the number of cycles needed to process each layer of the decoding operation is limited by the number of columns stored in memory bank A that participate in each layer of the decoding. It is noted, however, that memory bank B is not accessed during the third layer of decoding (e.g., layer 2), and memory bank D is not accessed during the fourth layer of decoding (e.g., layer 3). Furthermore, LDPC decoder may not access memory bank C during the first, fourth, ninth, or twelfth layers of decoding (e.g., layers 0, 3, 8, and 11, respectively). In some embodiments, the number of cycles needed to complete each layer of decoding may be reduced by reordering one or more columns of the base matrix 801 (and a received codeword associated with the base matrix 801) to increase the number of memory banks accessed, in parallel, by the LDPC decoder during each layer of decoding.

Figure 8B:
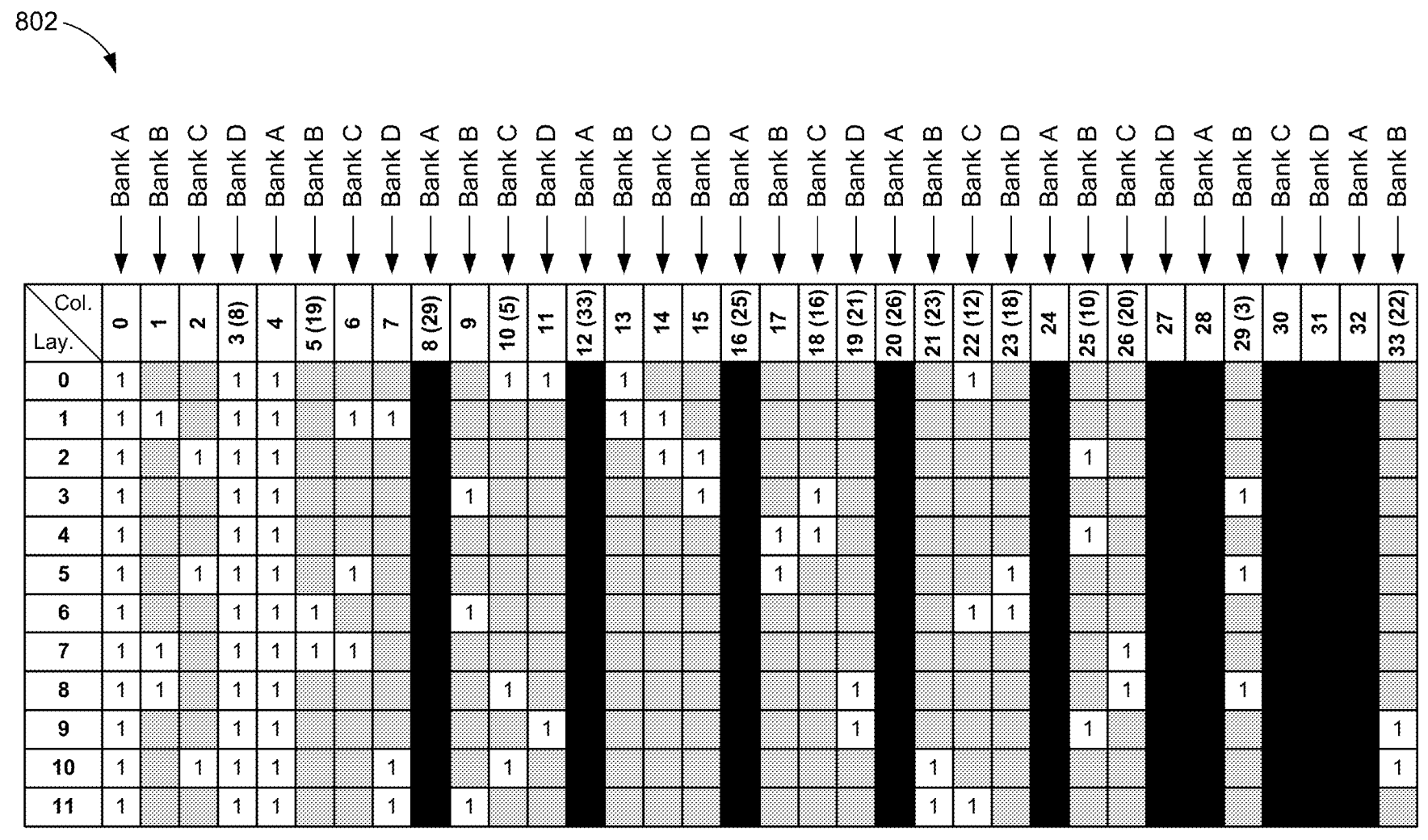

With reference for example to FIG. 8B, ten additional columns may be appended to the base matrix 801 to produce an extended base matrix (e.g., bringing the total number of columns to 34), and the columns of the extended base matrix may be reordered to produce a modified base matrix 802. In some embodiments, each of the additional columns (shown as a blacked-out rectangle) may correspond to an all-zero submatrix (e.g., or a submatrix having NULL data values). In the example of FIG. 8B, the modified base matrix 802 is produced by moving column 8 of the original base matrix 801 to the fourth column position (e.g., column 3) of the modified base matrix 802, moving column 3 of the original base matrix 801 to the thirtieth column position (e.g., column 29) of the modified base matrix 802, and moving column 29 of the extended base matrix to the ninth column position (e.g., column 8) of the modified base matrix 802.

Further, column 19 of the original base matrix 801 is moved to the sixth column position (e.g., column 5) of the modified base matrix 802, column 5 of the original base matrix 802 is moved to the eleventh column position (e.g., column 10) of the modified base matrix 802, column 10 of the original base matrix 801 is moved to the twenty-sixth column position (e.g., column 25) of the modified base matrix 802, column 25 of the original base matrix 801 is moved to the seventeenth column position (e.g., column 16) of the modified base matrix, column 16 of the original base matrix 801 is moved to the nineteenth column position (e.g., column 18) of the modified base matrix 802, column 18 of the original base matrix 801 is moved to the twenty-fourth column position (e.g., column 23) of the modified base matrix 802, column 23 of the original base matrix 801 is moved to the twenty-second column position (e.g., column 21) of the modified base matrix 802, and column 21 of the original base matrix 801 is moved to the twentieth column position (e.g., column 19) of the modified base matrix 802.

Further, column 12 of the original base matrix 801 is moved to the twenty-third column position (e.g., column 22) of the modified base matrix 802, column 22 of the original base matrix 802 is moved to the thirty-fourth column position (e.g., column 33) of the modified base matrix 802, and column 33 of the extended base matrix is moved to the thirteenth column position (e.g., column 12) of the modified base matrix 802. Still further, column 20 of the original base matrix 801 is moved to the twenty-seventh column position (e.g., column 26) of the modified base matrix 802, and column 26 of the extended base matrix is moved to the twenty-first column position (e.g., column 20) of the modified base matrix 802. In some embodiments, the first reordering stage of a decoder circuit may reorder one or more columns of a received codeword (e.g., encoded based on the LDPC code associated with the original base matrix 801) according to the modified base matrix 802.

Table 2 shows an example packing of a reordered codeword (e.g., into four memory banks A-D) based on the memory bank assignment associated with the modified base matrix 802, as depicted in FIG. 8B.

TABLE 2

| Layer | # Columns Participating from Bank A | # Columns Participating from Bank B | # Columns Participating from Bank C | #Columns Participating from Bank D | # Decoding Cycles Per Layer |
|---|---|---|---|---|---|
| 0 | 2 | 1 | 2 | 2 | 2 |
| 1 | 2 | 2 | 2 | 2 | 2 |
| 2 | 2 | 1 | 2 | 2 | 2 |
| 3 | 2 | 2 | 1 | 2 | 2 |
| 4 | 2 | 2 | 1 | 1 | 2 |
| 5 | 2 | 2 | 2 | 2 | 2 |
| 6 | 2 | 2 | 1 | 2 | 2 |
| 7 | 2 | 2 | 2 | 1 | 2 |
| 8 | 2 | 2 | 2 | 2 | 2 |
| 9 | 2 | 2 | 0 | 3 | 3 |
| 10 | 2 | 2 | 2 | 2 | 2 |
| 11 | 2 | 2 | 1 | 2 | 2 |
| | | | | Total: | 25 |

In the example packing configuration above, an LDPC decoder access each of the memory banks A-D with substantially similar frequency during each layer of decoding. For example, on average, each of the memory banks A-D is accessed twice per layer of decoding. Thus, as shown in Table 2, the number of cycles needed to process a layer of the base matrix 801 (or modified base matrix 802) is substantially the same for each layer of decoding. More specifically, the LDPC decoder may process each of the first nine layers (e.g., layers 0-8), and the last two layers (e.g., layers 10 and 11) of the decoding operation in only two cycles. The LDPC decoder may process the tenth layer (e.g., layer 9) of the decoding operation in three cycles. As a result, the LDPC decoder may complete the layered decoding operation in only 25 cycles (e.g., compared to 43 cycles for the packing configuration shown in Table 1). This may result in a 42% overall reduction in the number of processing cycles.

As illustrated in FIG. 8B, changing an order of one or more columns of the base matrix 801 may cause reordered codewords to be longer and more complex depending on the number of layers in the base matrix 801 (e.g., as additional columns are appended to the codeword to satisfy the reordering requirements across multiple layers). Thus, on some embodiments, a decoder circuit may include additional hardware resources to store and update the columns of the reordered codeword for each of a plurality of layers of decoding.

Figure 9:
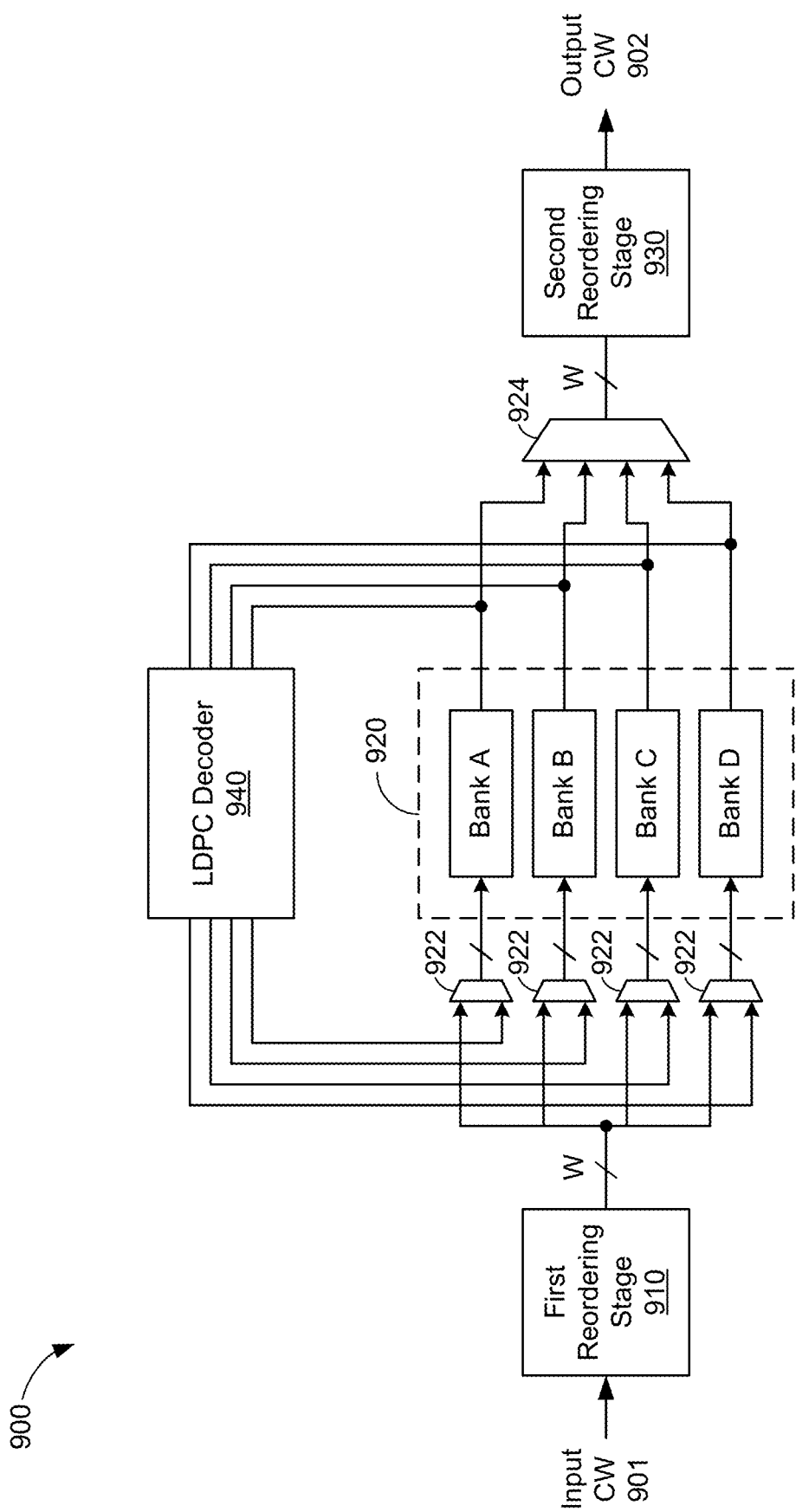
FIG. 9 is a block diagram of an example decoder circuit having a memory configured to store an extended codeword, in accordance with some embodiments.

FIG. 9 is a block diagram of an example decoder circuit 900 having a memory configured to store an extended codeword, in accordance with some embodiments. The decoder circuit 900 may be an example embodiment of the decoder circuit 600 of FIG. 6. More specifically, the decoder circuit 900 includes a first reordering stage 910, a memory 920, a second reordering stage 930, and an LDPC decoder 940. The decoder circuit 900 is configured to receive an input codeword 901, and to generate an output codeword 902 based on an LDPC decoding operation.

The input codeword 901 may include data arranged in a plurality of columns. The memory 920 may include a plurality of memory banks A-D to store the columns of the input codeword 901. In the example of FIG. 9, only 4 memory banks A-D are shown for simplicity. However, in actual implementations, the memory 920 may include fewer or more memory banks than those depicted in FIG. 9. Each of the memory banks A-D may be configured to store one or more columns of a received codeword. In some embodiments, each of the columns may be assigned to one of the memory banks A, B, C, or D based on an order of the columns in the received codeword. For example, every four consecutive columns of the input codeword 901 may be assigned to a different memory bank (e.g., in a round-robin fashion).

The first reordering stage 910 may be configured to reorder one or more columns of the input codeword 901. In some embodiments, the first reordering stage 910 may be configured to change a memory bank assignment for one or more of the columns (e.g., from an initial memory bank assignment). Accordingly, the first reordering stage 910 may generate a reordered codeword (e.g., based on the input codeword 901) to be stored in memory 920. In some aspects, the reordered codeword may correspond with a modified base matrix associated with the QC LDPC code. In some embodiments, the first reordering stage 910 may generate the reordered codeword by adding one or more additional columns to the input codeword 901 to produce an extended codeword (e.g., as described above with respect to FIGS. 7A-7C).

In an example, the input codeword 901 may correspond to a codeword encoded based on the LDPC code associated with the base matrix 801 of FIG. 8A. Thus, the input codeword 901 may include a plurality of columns $D_0$-$D_{23}$ that correspond with columns 0-23, respectively, of the original base matrix 801. As described above with respect to FIG. 8A, each of the columns $D_0$-$D_{23}$ may be initially assigned to one of the memory banks A-D (e.g., in a round-robin fashion) based on an order in which the columns $D_0$-$D_{23}$ are received by the decoder circuit 900 (e.g., at the first reordering stage 910). However, as shown in Table 1, storing the columns $D_0$-$D_{23}$ in this order may result in an inefficient use of memory resources when processing each layer of the decoding operation. In some embodiments, the first reordering stage 910 may reorder the columns of the input codeword 901 to change the memory bank assignment for one or more of the columns participating in each layer of the layered decoding operation. In some aspects, the first reordering stage 910 may reorder the columns of the input codeword 901 based, at least in part, on the modified base matrix 802 of FIG. 8B.

Figures 10A, 10B:
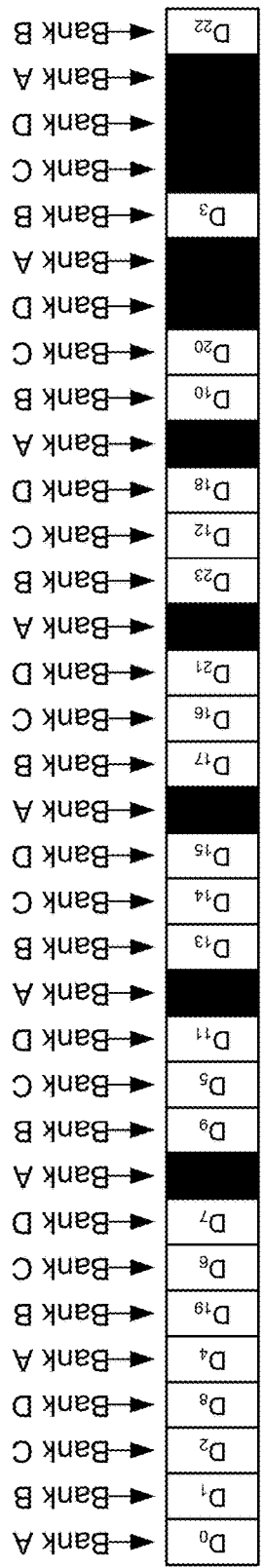
FIG. 10A shows an example reordered codeword associated with the modified base matrix depicted in FIG. 8B, in accordance with some embodiments.
FIG. 10B shows an example memory configured to store the reordered codeword depicted in FIG. 10A, in accordance with some embodiments.

With reference for example to FIG. 10A, the first reordering stage 910 may reorder the columns of the input codeword 901 to produce a reordered codeword 1000. As shown in FIG. 10A, the reordering of the columns in the reordered codeword 1000 may track the modifications (e.g., movement of columns) in the base matrix 801 to produce the modified base matrix 802. The reordered codeword 1000 may be output by the first reordering stage 910 and stored in memory 920. In some embodiments, the memory 920 may be configured to store each column of the reordered codeword 1000 (e.g., including the one or more additional columns).

FIG. 10B shows an example memory 1010 configured to store the reordered LDPC codeword 1000 depicted in FIG. 10A, in accordance with some embodiments. The memory 1010 may be an example embodiment of the memory 920 of FIG. 9 and/or memory 620 of FIG. 6. In some embodiments, each of the columns $D_0$-$D_{23}$ may be assigned to one of the memory banks A, B, C, or D based on an order of the columns in the reordered codeword 1000. More specifically, as described with respect to FIG. 5B, every four consecutive columns of the reordered codeword 1000 may be assigned to one of the memory banks A, B, C or D in a round-robin fashion (e.g., as shown in FIG. 10A). Thus, in the example of FIG. 10B, memory bank A stores columns $D_0$ and $D_4$, memory bank B stores columns $D_1$, $D_{19}$, $D_9$, $D_{13}$, $D_{17}$, $D_{23}$, $D_{10}$, $D_3$, and $D_{22}$, memory bank C stores columns $D_2$, $D_6$, $D_5$, $D_{14}$, $D_{16}$, $D_{12}$, and $D_{20}$, and memory bank D stores columns $D_8$, $D_7$, $D_{11}$, $D_{15}$, $D_{21}$, and $D_{18}$.

The LDPC decoder 940 may implement a layered decoding operation by accessing the plurality of memory banks A-D in parallel. As described above with respect to Table 2, the LDPC decoder 940 may process the reordered codeword 1000 in only 25 cycles. During each cycle, the LDPC decoder 940 may read up to one column of data from each of the memory banks A-D in parallel, check the values associated with the selected columns against the base matrix 801 (or the modified base matrix 802), update the values for the selected columns based on the parity-check operation, and write the updated values back to memory 920 (e.g., to be used for a subsequent layer of the decoding operation). In some embodiments a set of multiplexers (or switches) 922 may selectively couple the outputs of the LDPC decoder 940 or the outputs of the first reordering stage 910 to the inputs of the memory 920. For example, the multiplexers 922 may select the outputs of the first reordering stage 910 when a reordered codeword is initially written to memory 920, and may select the outputs of the LDPC decoder 940 when updating the values of the reordered codeword stored in memory (e.g., at the end of each cycle of the layered decoding operation).

When the layered decoding operation is completed, the second reordering stage 930 may retrieve a decoded codeword from memory 920. In some embodiments, a multiplexer (or switch) 924 may be used to read out the columns from each of the memory banks A-D based at least in part on an order in which the columns were originally stored in memory 920 (e.g., when output by the first reordering stage 910). For example, the decoded codeword read out by the multiplexer 924 may look substantially similar to the reordered codeword 1000 of FIG. 10A (e.g., as output by the first reordering stage 910). The second reordering stage 930 may then reorder the columns of the decoded codeword to produce an output codeword 902 that substantially tracks the input codeword 902. For example, the second reordering stage 930 may reverse the reordering performed by the first reordering stage 910. With reference for example to FIG.

10A, the second reordering stage 930 may rearrange the columns $D_0$-$D_{23}$ of the decoded codeword back to their original order, while removing any additional columns added by the first reordering stage 910.

As described above with respect to FIGS. 8A and 8B, changing an order of one or more columns of the base matrix 801 may cause reordered codewords to be longer and more complex depending on the number of layers in the base matrix 801 (e.g., as additional columns are appended to the codeword to satisfy the reordering requirements across multiple layers). With reference for example to FIG. 10A, the reordered codeword 1000 (which is 34 columns in length) is 43% longer than a codeword based on the original base matrix 801 (which is only 24 columns in length). Thus, the reordered codeword 1000 may require more memory resources to store each column of the extended codeword (e.g., including the additional columns which do not participate in the decoding). In decoder circuits with limited memory resources, the memory may be unable to store each column of an extended codeword. Thus, in some embodiments, a decoder circuit may include additional circuitry to selectively reorder the columns stored in memory between individual layers of decoding.

The first reordering stage 910 and/or the second reordering stage 930 may be implemented in hardware, software, firmware, or any combination thereof. In some aspects, the first and second reordering stages 910 and 930 may be implemented together in an integrated logic device. In other aspects, the first and second reordering stages 910 and 930 may be implemented separately, as discrete but interoperable logic devices. If implemented in software, the reordering operations may be realized at least in part by a non-transitory processor-readable storage medium storing instructions that, when executed by a processor, performs one or more of the operations described above. The term "processor," as used herein, may refer to any general purpose processor, conventional processor, controller, microcontroller, and/or state machine capable of executing scripts or instructions of one or more software programs stored in memory.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The reordering operations additionally, or alternatively, may be realized at least in part by a processor-readable communication medium that carries or communicates code in the form of instructions or data structures and that can be accessed, read, and/or executed by a computer or other processor.

Figure 11:
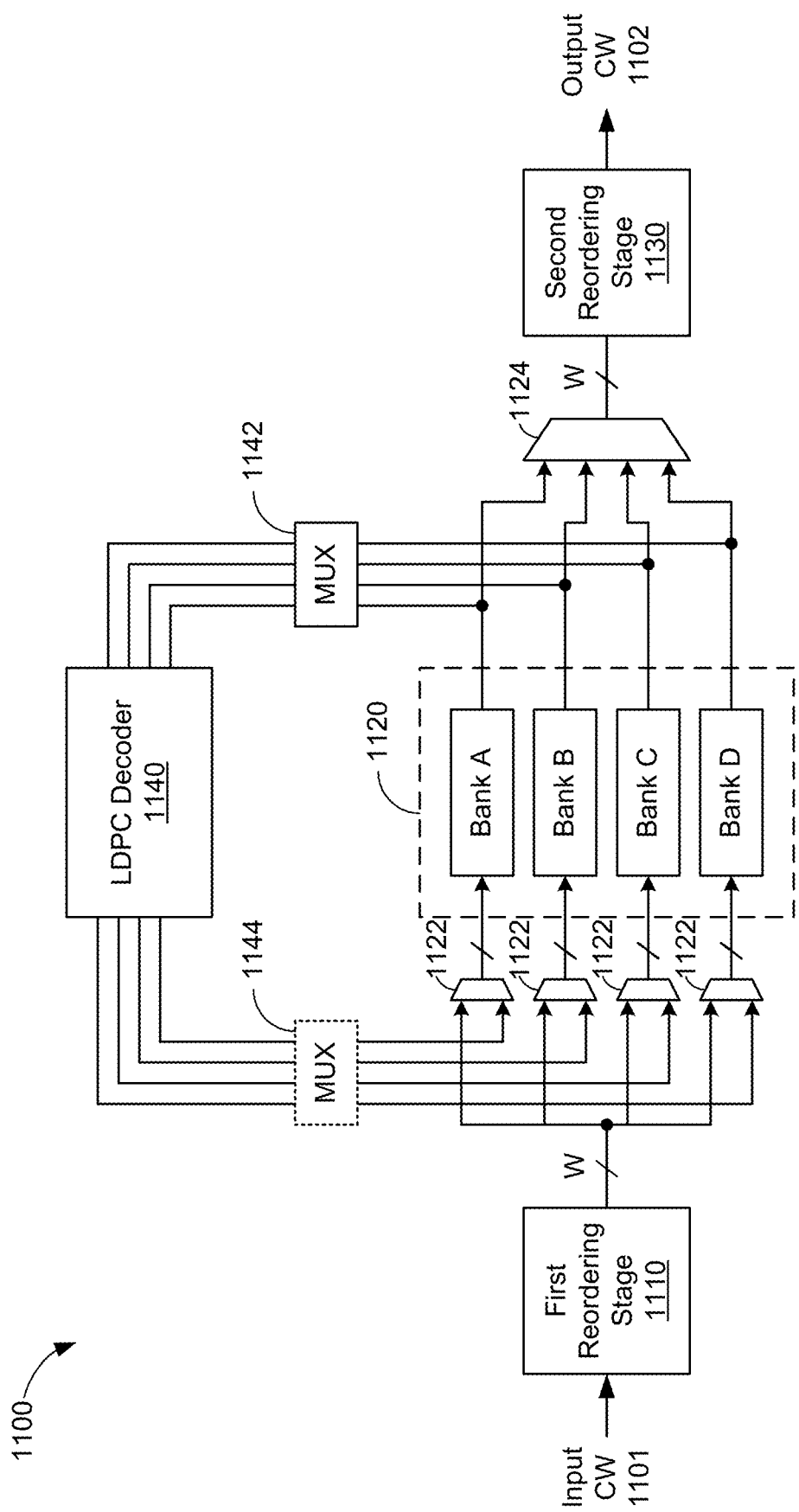
FIG. 11 is a block diagram of an example decoder circuit having circuitry to selectively reorder a codeword during memory access operations, in accordance with some embodiments.

FIG. 11 is a block diagram of an example decoder circuit 1100 having circuitry to selectively reorder a codeword during memory access operations, in accordance with some embodiments. The decoder circuit 1100 may be an example embodiment of the decoder circuit 600 of FIG. 6. More specifically, the decoder circuit 1100 includes a first reordering stage 1110, a memory 1120, a second reordering stage 1130, and an LDPC decoder 1140. A multiplexer 1142 is coupled between the memory 1120 and the LDPC decoder 1140 to selectively change an order in which columns are read from the memory 1120. The decoder circuit 1100 is configured to receive an input codeword 1101, and to generate an output codeword 1102 based on an LDPC decoding operation.

The input codeword 1101 may include data arranged in a plurality of columns. The memory 1120 may include a plurality of memory banks A-D to store the columns of the input codeword 1101. In the example of FIG. 11, only 4 memory banks A-D are shown for simplicity. However, in actual implementations, the memory 1120 may include fewer or more memory banks than those depicted in FIG. 11. Each of the memory banks A-D may be configured to store one or more columns of a received codeword. In some embodiments, each of the columns may be assigned to one of the memory banks A, B, C, or D based on an order of the columns in the received codeword. For example, every four consecutive columns of the input codeword 1101 may be assigned to a different memory bank (e.g., in a round-robin fashion).

The first reordering stage 1110 may be configured to reorder one or more columns of the input codeword 1101. In some embodiments, the first reordering stage 1110 may be configured to change a memory bank assignment for one or more of the columns (e.g., from an initial memory bank assignment). Accordingly, the first reordering stage 1110 may generate a reordered codeword (e.g., based on the input codeword 1101) to be stored in memory 1120. In some embodiments, the first reordering stage 1110 may generate the reordered codeword without adding any additional columns to the input codeword 1101. For example, in contrast with the first reordering stage 910 of FIG. 9, the first reordering stage 1110 may not produce an extended codeword at its output.

In an example, the input codeword 1101 may correspond to a codeword encoded based on the LDPC code associated with the base matrix 801 of FIG. 8A. Thus, the input codeword 1101 may include a plurality of columns $D_0$-$D_{23}$ that correspond with columns 0-23, respectively, of the original base matrix 801. As described above with respect to FIG. 8A, each of the columns $D_0$-$D_{23}$ may be initially assigned to one of the memory banks A-D (e.g., in a round-robin fashion) based on an order in which the columns $D_0$-$D_{23}$ are received by the decoder circuit 1100 (e.g., at the first reordering stage 1110). However, as shown in Table 1, storing the columns $D_0$-$D_{23}$ in this order may result in an inefficient use of memory resources when processing each layer of the decoding operation. In some embodiments, the first reordering stage 1110 may reorder the columns of the input codeword 1101 to change the memory bank assignment for one or more of the columns participating in at least a first layer (e.g., layer 0) of the layered decoding operation.

With reference for example to FIG. 8A, it is noted that only columns $D_0$, $D_4$, $D_5$, $D_8$, $D_{11}$, $D_{12}$, and $D_{13}$ of the input codeword 1101 participate in the first layer of decoding. By reordering the codeword as shown in FIG. 10A, columns $D_0$ and $D_4$ may be assigned to memory bank A, column $D_{13}$ may be assigned to memory bank B, columns $D_5$ and $D_{12}$ may be assigned to memory bank C, and columns $D_8$ and $D_{11}$ may be assigned to memory bank D. This may allow the LDPC decoder 1140 to complete the first layer of the decoding operation in only two cycles. However, the reordered codeword 1000 of FIG. 10A is also substantially longer than the input codeword 1101 due to the additional columns appended to the original codeword. It is noted, however, that the additional columns do not participate in any layer of the decoding operation. Thus, in some embodiments, the additional columns may be substituted for one or more columns $D_0$-$D_{23}$ of the original codeword 1101 for purposes of storing the reordered codeword in memory.

Figures 12A, 12B:
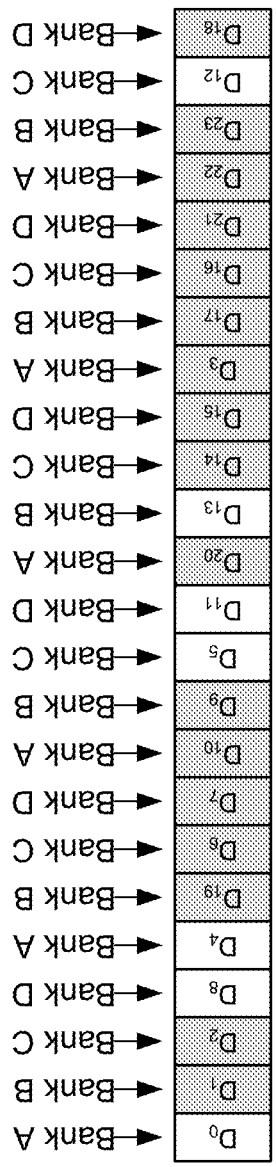
FIG. 12A shows an example reordered codeword associated with the modified base matrix depicted in FIG. 8B, in accordance with some embodiments.
FIG. 12B shows an example memory configured to store the reordered codeword depicted in FIG. 12, in accordance with some embodiments.

With reference for example to FIG. 12A, the first reordering stage 1110 may reorder the columns of the input codeword 1101 to produce a reordered codeword 1200. As shown in FIG. 12A, the reordered codeword 1200 include the first twenty-four columns of the reordered codeword 1000 of FIG. 10A. However, the additional (e.g., NULL data) columns that were inserted into the ninth, thirteenth, seventeenth, and twenty-first column positions of the reordered codeword 1000 have been substituted for columns $D_{10}$, $D_{20}$, $D_3$, and $D_{22}$, respectively, of the original codeword. Thus, the reordered codeword 1200 may be equal in length to the original input codeword 1101. The reordered codeword 1200 may be output by the first reordering stage 1110 and stored in memory 1120.

FIG. 12B shows an example memory 1210 configured to store the reordered LDPC codeword 1200 depicted in FIG. 12A, in accordance with some embodiments. the memory 1210 may be an example embodiment of the memory 1120 of FIG. 11 and/or memory 620 of FIG. 6. In some embodiments, each of the columns $D_0$-$D_{23}$ may be assigned to one of the memory banks A, B, C, or D based on an order of the columns in the reordered codeword 1200. More specifically, as described with respect to FIG. 5B, every four consecutive columns of the reordered codeword 1200 may be assigned to one of the memory banks A, B, C, or D in a round-robin fashion (e.g., as shown in FIG. 12A). Thus, in the example of FIG. 12B, memory bank A stores columns $D_0$, $D_4$, $D_{10}$, $D_{20}$, $D_3$, and $D_{22}$, memory bank B stores columns $D_1$, $D_{19}$, $D_9$, $D_{13}$, $D_{17}$, and $D_{23}$, memory bank C stores columns $D_2$, $D_6$, $D_5$, $D_{14}$, $D_{16}$, and $D_{12}$, and memory bank D stores columns $D_8$, $D_7$, $D_{11}$, $D_{15}$, $D_{21}$, and $D_{18}$. It is noted that the memory 1210 uses significantly less resources to store a reordered codeword than the memory 1010 of FIG. 10B The LDPC decoder 1140 may implement a layered decoding operation by accessing the plurality of memory banks A-D in parallel. In some embodiments, the multiplexer 1142 may selectively rearrange the order in which columns are read from the memory 1120. For example, in some aspects, the LDPC decoder 1140 may be configured to use the base matrix 801 to decode selected columns of the input codeword 1101. With reference for example to FIG. 8A, during a first layer of decoding (e.g., layer 0) the LDPC decoder 1140 may expect to read columns $D_0$, $D_4$, $D_8$, and $D_{12}$ from memory bank A, columns $D_5$ and $D_{13}$ from memory bank B, and column $D_{11}$ from memory bank D. However, as a result of the reordering performed by the first reordering stage 1110, columns $D_5$ and $D_{12}$ may be currently stored in memory bank C, while column $D_8$ may be stored in memory bank D.

During a first cycle of the decoding, the multiplexer 1142 may concurrently read columns $D_0$, $D_{13}$, $D_5$, and $D_8$ from memory banks A, B, C, and D, respectively, and provide the selected columns to the LDPC decoder 1140 for processing. The LDPC decoder 1140 may check the values associated with the selected columns against the base matrix 801, update the values for the selected columns based on the parity-check operation, and write the updated values back to memory 1120 (e.g., to be used for a subsequent layer of the decoding operation). In some embodiments, the multiplexer 1142 may track the memory locations of the updated columns (e.g., output by the LDPC decoder 1140) as they are written back to memory 1120. Accordingly, the multiplexer 1142 will know where each of the updated columns (e.g., columns $D_0$, $D_{13}$, $D_5$, and $D_8$) is stored if the multiplexer 1142 needs to retrieve the columns again for one or more subsequent layers of the decoding operation In some other embodiments, the decoder circuit 1100 may include a second multiplexer 1144 to rearrange the order of the updated columns (e.g., output by the LDPC decoder 1140) such that one or more of the columns may be written to a different memory bank from the one in which it was previously stored. For example, the second multiplexer 1144 may write each of the updated columns $D_0$, $D_{13}$, $D_5$, and $D_8$ to a particular memory bank in a manner that optimizes the number of parallel decoding operations performed by the LDPC decoder 1140 the next time the selected columns participate in the decoding operation (e.g., for a subsequent layer of the decoding). With reference for example to FIG. 8A, columns $D_0$, $D_4$, and $D_8$ participate in each layer of decoding. However, column $D_{10}$ is also stored in memory bank A (along with columns $D_0$ and $D_4$) but does not participate in the decoding operation until the third layer (e.g., layer 2). Thus, it may not be feasible to move column $D_{10}$ to another memory bank before the third layer of decoding. To reduce the number of memory accesses to memory bank A during the third layer of decoding, at least one of columns $D_0$ or $D_4$ may be moved to a different memory bank (e.g., other than memory bank A) between the second and third layers of decoding and/or between the first and second layers of decoding.

As described above, the multiplexer 1142 (and multiplexer 1144) may continually rearrange the order in which selected columns of the input codeword 1101 are read from (and written to) the memory 1120. This may ensure that the columns are packed in such a way optimizes the number of parallel decoding operations performed by the LDPC decoder 1140 for each layer of the decoding operation, without increasing the amount of memory needed to store the input codeword 1101. In some embodiments, a set of multiplexers (or switches) 1122 may selectively couple the outputs of the LDPC decoder 1140 (or second multiplexer 1144) or the outputs of the first reordering stage 1110 to the inputs of the memory 1120. For example, the multiplexers 922 may select the outputs of the first reordering stage 1110 when a reordered codeword is initially written to memory 1120, and may select the outputs of the LDPC decoder 1140 (or second multiplexer 1144) when updating the values of the reordered codeword stored in memory (e.g., at the end of each cycle of the layered decoding operation).

When the layered decoding operation is completed, the second reordering stage 1130 may retrieve a decoded codeword from memory 1120. In some embodiments, a multiplexer (or switch) 1124 may be used to read out the columns from each of the memory banks A-D based at least in part on an order in which the columns were last stored in memory 1120 (e.g., in the order arranged by the multiplexers 1142 and/or 1144). The second reordering stage 1130 may then reorder the columns of the decoded codeword to produce an output codeword 1102 that substantially tracks the input codeword 1102. For example, the second reordering stage 1130 may reverse the reordering performed by the first reordering stage 1110 and/or the second multiplexer 1144. With reference for example to FIG. 12A, the second reordering stage 1130 may rearrange the columns $D_0$-$D_{23}$ of the decoded codeword back to their original order.

The first reordering stage 1110 and/or the second reordering stage 1130 may be implemented in hardware, software, firmware, or any combination thereof. In some aspects, the first and second reordering stages 1110 and 1130 may be implemented together in an integrated logic device. In other aspects, the first and second reordering stages 1110 and 1130 may be implemented separately, as discrete but interoperable logic devices. If implemented in software, the reordering operations may be realized at least in part by a non-transitory processor-readable storage medium storing instructions that, when executed by a processor, performs one or more of the operations described above. The term "processor," as used herein, may refer to any general purpose processor, conventional processor, controller, microcontroller, and/or state machine capable of executing scripts or instructions of one or more software programs stored in memory.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The reordering operations additionally, or alternatively, may be realized at least in part by a processor-readable communication medium that carries or communicates code in the form of instructions or data structures and that can be accessed, read, and/or executed by a computer or other processor.

Figure 13:
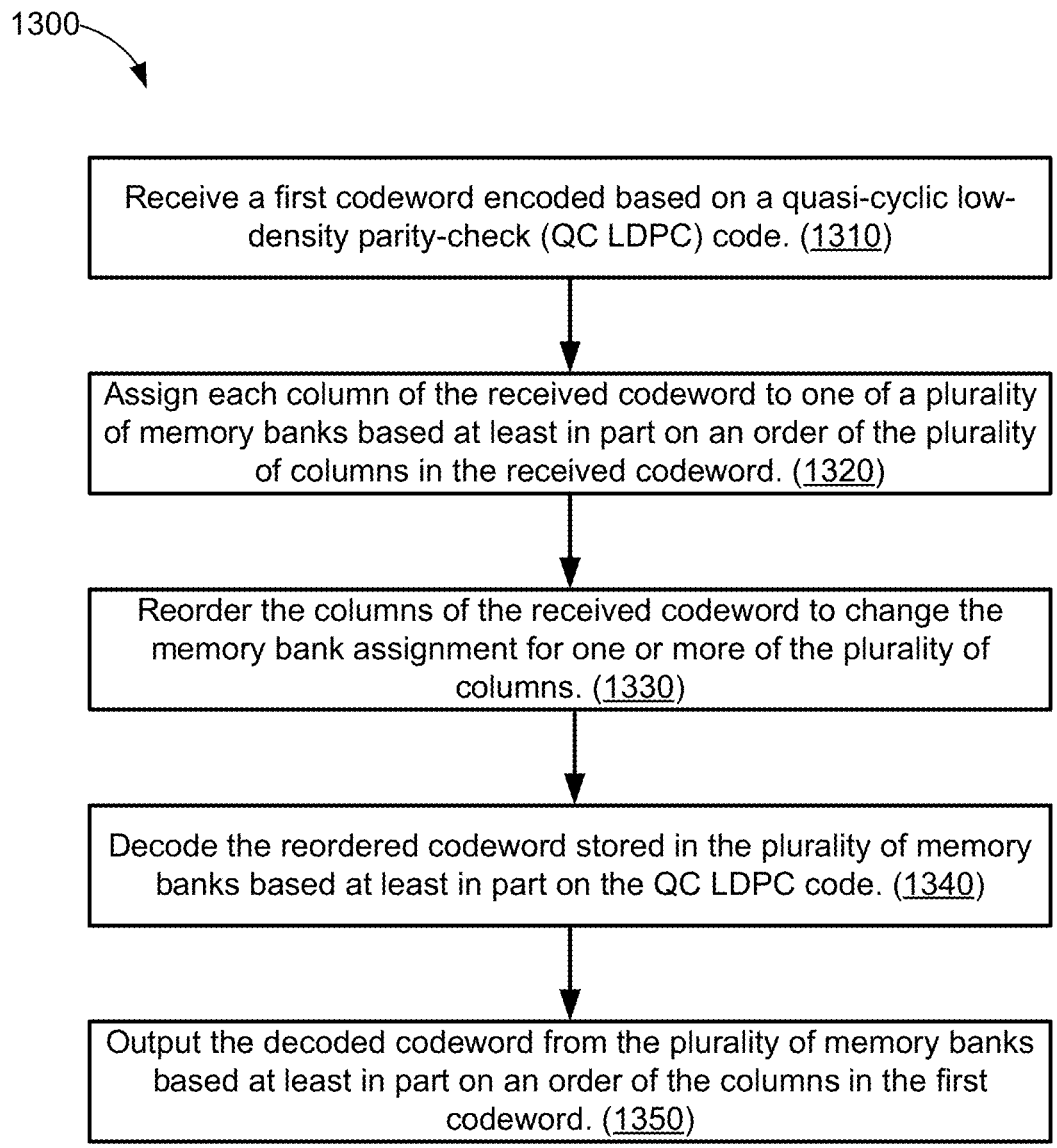
FIG. 13 is an illustrative flow chart depicting an example operation for reordering codewords for LDPC decoding, in accordance with some embodiments.

FIG. 13 is an illustrative flow chart depicting an example operation 1300 for reordering codewords for LDPC decoding, in accordance with some embodiments. Although described below with respect to the decoder circuit 600 of FIG. 6, the example operation 1300 may be performed by any suitable decoder circuit.

The decoder circuit 600 receives a first codeword encoded based on a quasi-cyclic low-density parity-check (QC LDPC) code (1310). The first codeword may include data arranged in a plurality of columns. As described above with respect to FIGS. 2A and 2B, each column of data may comprise a plurality of bits (e.g., or a vector of data) that may be decoded based on a circulant submatrix associated with the QC LDPC code.

The decoder circuit 600 may assign each column of the received codeword to one of a plurality of memory banks based at least in part on an order of the plurality of columns in the received codeword (1320). As described above with respect to FIGS. 5A and 5B, each successive column of a received codeword may be assigned to a different one of the memory banks (e.g., in a round-robin fashion).

The decoder circuit 600 may reorder the columns of the received codeword to change the memory bank assignment for one or more of the plurality of columns (1330). For example, the reordering of the columns may depend on the number of memory banks in the decoder circuit 600. In some embodiments, the first reordering stage 610 may redistribute one or more of the columns between the different memory banks to increase a number of parallel decoding operations that may be performed by the decoder circuit 600 (e.g., per layer of decoding), thereby reducing the number of cycles to decode the received codeword.

The decoder circuit 600 may then decode the reordered codeword stored in the plurality of memory banks based at least in part on the QC LDPC code (1340). For example, during each processing cycle, the LDPC decoder 640 may read up to one column of data from each of the memory banks A-D in parallel, check the values associated with the selected columns against a base matrix (H) associated with the QC LDPC code, update the values for the selected columns based on the parity-check operation, and write the updated values back to memory. In some embodiments, the reordering of the codeword may correspond with one or more modifications to the base matrix H. Thus, in some aspects, the LPDC decoder 640 may decode the reordered codeword based at least in part on a modified base matrix ($H_E$).

Finally, the decoder circuit 600 may output the decoded codeword from the plurality of memory banks based at least in part on an order of the columns in the first codeword (1350). In some embodiments, the second reordering stage 630 may reverse the first reordering stage. Thus, the second reordering stage 630 may reorder the columns of the decoded codeword to produce an output codeword that substantially tracks the input codeword (e.g., with updated column values as a result of the decoding).

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example embodiments have been described with reference to specific example embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A decoder circuit, comprising:
   an input to receive a codeword encoded based on a quasi-cyclic (QC) low-density parity-check (LDPC) code, wherein the received codeword includes data arranged in a plurality of columns;
   a plurality of memory banks to store the received codeword, wherein each column of the received codeword is assigned to one of the plurality of memory banks based at least in part on an order of the plurality of columns in the received codeword;

a first reordering stage to reorder the columns in the received codeword to generate a reordered codeword, wherein reordering the columns in the received codeword changes a memory bank assignment for one or more of the plurality of columns;

an LDPC decoder to generate a decoded codeword, the decoded codeword generated by decoding the reordered codeword stored in the plurality of memory banks based at least in part on the QC LDPC code; and a second reordering stage to output the decoded codeword from the plurality of memory banks based at least in part on an order of the columns in the received codeword.

2. The decoder circuit of claim 1, wherein the first reordering stage is to reorder the columns in the received codeword based at least in part on a number of memory banks in the plurality of memory banks.

3. The decoder circuit of claim 1, wherein the first reordering stage is to reorder the columns in the received codeword to increase a number of columns decoded in parallel by the LDPC decoder.

4. The decoder circuit of claim 1, wherein the first reordering stage is to reorder the columns in the received codeword based at least in part on selected columns of the received codeword that participate in the decoding.

5. The decoder circuit of claim 4, wherein the first reordering stage is to reorder the columns in the received codeword to equalize a distribution of the selected columns across the plurality of memory banks.

6. The decoder circuit of claim 1, wherein the received codeword is associated with a base matrix (H), and wherein the first reordering stage is to reorder the plurality of columns in the received codeword based at least in part on a modification to the base matrix H.

7. The decoder circuit of claim 6, wherein the modification to the base matrix H results in an extended base matrix ($H_E$) having a plurality of layers, and wherein the LDPC decoder is to decode the reordered codeword by processing each of the plurality of layers of the extended base matrix $H_E$ in succession.

8. The decoder circuit of claim 7, further comprising:
a first multiplexer to change an order of the columns in the reordered codeword, for each of the plurality of layers, when reading the reordered codeword from the plurality of memory banks to the LDPC decoder.

9. The decoder circuit of claim 8, further comprising:
a second multiplexer to change an order of the columns in the decoded codeword, for each of the plurality of layers, when writing the decoded codeword from the LDPC decoder to the plurality of memory banks.

10. The decoder circuit of claim 1, wherein the first reordering stage is further configured to:
add one or more additional columns to the received codeword to produce an extended codeword, wherein the plurality of memory banks is configured to store each column of the extended codeword.

11. A method, comprising:
receiving a codeword encoded based on a quasi-cyclic (QC) low-density parity-check (LDPC) code, wherein the received codeword includes data arranged in a plurality of columns;

assigning each column of the received codeword to one of a plurality of memory banks based at least in part on an order of the plurality of columns in the received codeword;

reordering the columns in the received codeword to generate a reordered codeword, wherein reordering the columns in the received codeword changes the memory bank assignment for one or more of the plurality of columns;

decoding, using an LDPC decoder, the reordered codeword stored in the plurality of memory banks based at least in part on the QC LDPC code, wherein decoding the reordered codeword generates a decoded codeword; and outputting the decoded codeword from the plurality of memory banks based at least in part on an order of the columns in the received codeword.

12. The method of claim 11, wherein the reordering of the columns in the received codeword is based at least in part on a number of memory banks in the plurality of memory banks.

13. The method of claim 11, wherein the reordering of the columns in the received codeword is to increase a number of columns decoded in parallel by the LDPC decoder.

14. The method of claim 11, wherein the reordering of the columns in the received codeword is based at least in part on selected columns of the received codeword that participate in the decoding.

15. The method of claim 14, wherein the reordering of the columns in the received codeword is to equalize a distribution of the selected columns across the plurality of memory banks.

16. The method of claim 11, wherein the received codeword is associated with a base matrix (H), and wherein the reordering of the plurality of columns in the received codeword is based at least in part on a modification to the base matrix H.

17. The method of claim 16, wherein the modification to the base matrix H results in an extended base matrix ($H_E$) having a plurality of layers, and wherein the decoding comprises:
decoding the reordered codeword by processing each of the plurality of layers of the extended base matrix $H_E$ in succession.

18. The method of claim 17, further comprising:
changing an order of the columns in the reordered codeword, for each of the plurality of layers, when reading the reordered codeword from the plurality of memory banks to the LDPC decoder.

19. The method of claim 18, further comprising:
changing an order of the columns in the decoded codeword, for each of the plurality of layers, when writing the decoded codeword from the LDPC decoder to the plurality of memory banks.

20. The method of claim 11, wherein the reordering of the plurality of columns comprises:
adding one or more additional columns to the received codeword to produce an extended codeword; and
storing each column of the extended codeword in the plurality of memory banks.

* * * * *